United States Patent
Lei et al.

(10) Patent No.: US 12,073,162 B2
(45) Date of Patent: *Aug. 27, 2024

(54) CAPACITIVE ISOLATION STRUCTURE INSERT FOR REVERSED SIGNALS

(71) Applicant: TAIWAN SEMICONDUCTOR MANUFACTURING COMPANY, LTD., Hsinchu (TW)

(72) Inventors: Cheok-Kei Lei, Hsinchu (TW); Jerry Chang Jui Kao, Hsinchu (TW); Chi-Lin Liu, Hsinchu (TW); Hui-Zhong Zhuang, Hsinchu (TW); Zhe-Wei Jiang, Hsinchu (TW); Chien-Hsing Li, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/060,118

(22) Filed: Nov. 30, 2022

(65) Prior Publication Data

US 2023/0090213 A1 Mar. 23, 2023

Related U.S. Application Data

(63) Continuation of application No. 17/195,133, filed on Mar. 8, 2021, now Pat. No. 11,526,649, which is a (Continued)

(51) Int. Cl.
*G06F 30/367* (2020.01)
*G06F 30/20* (2020.01)
(Continued)

(52) U.S. Cl.
CPC .......... *G06F 30/367* (2020.01); *G06F 30/20* (2020.01); *G06F 30/392* (2020.01);
(Continued)

(58) Field of Classification Search
CPC ........ G06F 30/367; G06F 30/20; G06F 30/39; G06F 30/392; G06F 30/394;
(Continued)

(56) References Cited

U.S. PATENT DOCUMENTS 5,973,363 A * 10/1999 Staab ................ H01L 21/02532
257/E27.111
5,973,382 A 10/1999 Burgener et al.
(Continued)

FOREIGN PATENT DOCUMENTS

CN 101483193 B * 4/2011 ......... H01L 29/0649
CN 102339331 A * 2/2012
(Continued)

OTHER PUBLICATIONS

Ravishanakar et al. ("Optimal shielding/spacing metrics for low power design"; Proceedings of the IEEE Computer Society Annual Symposium on VLSI (ISVLSI'03); Mar. 2003; pp. 1-6).

*Primary Examiner* — Brian Ngo
(74) *Attorney, Agent, or Firm* — Hauptman Ham, LLP

(57) ABSTRACT

A method of modifying an integrated circuit layout includes determining whether a first conductive line and a second conductive line are subject to a parasitic capacitance above a parasitic capacitance threshold. The method further includes adjusting the integrated circuit layout by moving the first conductive line in the integrated circuit layout in response to determining to move the first conductive line. The method further includes inserting an isolation structure between the first and second conductive lines in the integrated circuit layout in response to determining not to move the first conductive line.

20 Claims, 16 Drawing Sheets

Related U.S. Application Data continuation of application No. 16/514,210, filed on Jul. 17, 2019, now Pat. No. 10,943,050.

(60) Provisional application No. 62/753,363, filed on Oct. 31, 2018.

(51) Int. Cl.
*G06F 30/392* (2020.01)
*G06F 30/394* (2020.01)
*G06F 30/398* (2020.01)
*H01L 23/522* (2006.01)
*H01L 27/02* (2006.01)

(52) U.S. Cl.
CPC .......... *G06F 30/394* (2020.01); *G06F 30/398* (2020.01); *H01L 23/5223* (2013.01); *H01L 27/0207* (2013.01)

(58) Field of Classification Search
CPC ............... G06F 30/398; H01L 23/5223; H01L 23/5222; H01L 27/0207
See application file for complete search history.

(56) References Cited

U.S. PATENT DOCUMENTS

| | | | |
|---|---|---|---|
| 6,029,117 A * | 2/2000 | Devgan | G06F 30/367 702/58 |
| 6,209,123 B1 | 3/2001 | Maziasz et al. | |
| 6,230,302 B1 * | 5/2001 | Gabele | G06F 30/3312 716/108 |
| 6,253,355 B1 * | 6/2001 | Chadha | G06F 30/39 716/112 |
| 6,510,545 B1 * | 1/2003 | Yee | G06F 30/394 257/E23.114 |
| 6,523,158 B1 | 2/2003 | Hidaka | |
| 6,611,944 B2 * | 8/2003 | Elzinga | G06F 30/394 716/130 |
| 7,013,253 B1 * | 3/2006 | Cong | G06F 30/367 703/19 |
| 7,177,783 B2 * | 2/2007 | Wu | G06F 30/367 703/2 |
| 7,257,797 B1 * | 8/2007 | Waller | G06F 30/394 716/122 |
| 7,260,442 B2 | 8/2007 | Hwang et al. | |
| 7,337,419 B2 * | 2/2008 | Hossain | H01L 23/5222 716/115 |
| 7,448,014 B2 * | 11/2008 | Lavin | G06F 30/39 716/135 |
| 7,698,670 B2 * | 4/2010 | Masumura | G06F 30/39 716/120 |
| 7,721,236 B2 | 5/2010 | Hwang et al. | |
| 7,739,624 B2 * | 6/2010 | McElvain | G06F 30/394 716/101 |
| 8,056,035 B2 | 11/2011 | Buck et al. | |
| 8,095,903 B2 * | 1/2012 | Birch | G06F 30/394 716/129 |
| 8,456,856 B2 | 6/2013 | Lin et al. | |
| 8,595,669 B1 | 11/2013 | Keller et al. | |
| 9,201,108 B2 | 12/2015 | Yun et al. | |
| 9,256,709 B2 | 2/2016 | Yu et al. | |
| 9,542,519 B2 * | 1/2017 | Makino | G06F 30/3312 |
| 10,380,308 B2 * | 8/2019 | Correale, Jr. | G06F 30/394 |
| 10,447,270 B2 | 10/2019 | Ware et al. | |
| 10,783,296 B1 * | 9/2020 | Ershov | G06F 30/327 |
| 10,943,050 B2 | 3/2021 | Lei et al. | |
| 11,062,067 B2 * | 7/2021 | Hills | G06F 30/367 |
| 11,526,649 B2 * | 12/2022 | Lei | G06F 30/392 |
| 2002/0133791 A1 * | 9/2002 | Cohn | G06F 30/327 716/113 |
| 2004/0098684 A1 * | 5/2004 | Amekawa | G06F 30/30 716/115 |
| 2007/0106969 A1 | 5/2007 | Birch et al. | |
| 2008/0184186 A1 * | 7/2008 | Belaidi | G06F 30/394 716/134 |
| 2013/0147547 A1 * | 6/2013 | Nalawade | G06F 30/36 327/551 |
| 2014/0040838 A1 | 2/2014 | Liu et al. | |
| 2014/0145301 A1 | 5/2014 | Moghe et al. | |
| 2015/0145017 A1 | 5/2015 | Wang et al. | |
| 2015/0278429 A1 | 10/2015 | Chang | |
| 2017/0221554 A1 | 8/2017 | Baeck et al. | |
| 2020/0065452 A1 | 2/2020 | Chunag et al. | |
| 2020/0089836 A1 * | 3/2020 | Lu | G03F 1/70 |

FOREIGN PATENT DOCUMENTS

| | | | | |
|---|---|---|---|---|
| CN | 102622468 A | * | 8/2012 | |
| CN | 103677456 | | 3/2014 | |
| CN | 109585551 | | 4/2019 | |
| FR | 2989218 A1 | * | 10/2013 | ............ H01L 21/77 |
| JP | H07297285 A | * | 11/1995 | |
| JP | H10178100 A | * | 6/1998 | |
| JP | 2002259480 | | 9/2002 | |
| JP | 2004110627 A | * | 4/2004 | |
| JP | 2004281698 A | * | 10/2004 | |
| JP | 2005020392 A | * | 1/2005 | |
| KR | 20160063225 A | * | 6/2016 | |
| WO | WO-2013121996 | | 8/2013 | |

\* cited by examiner

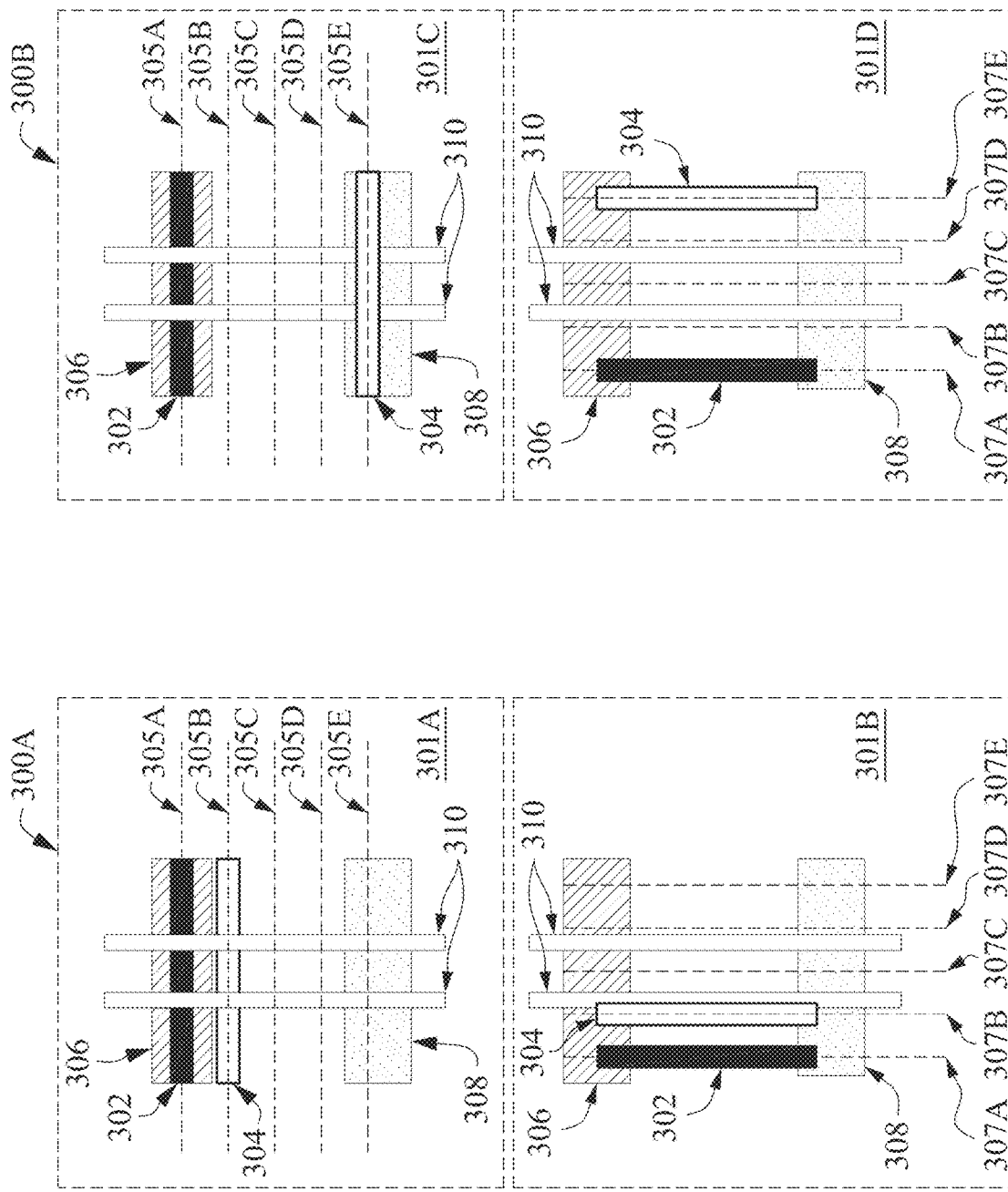

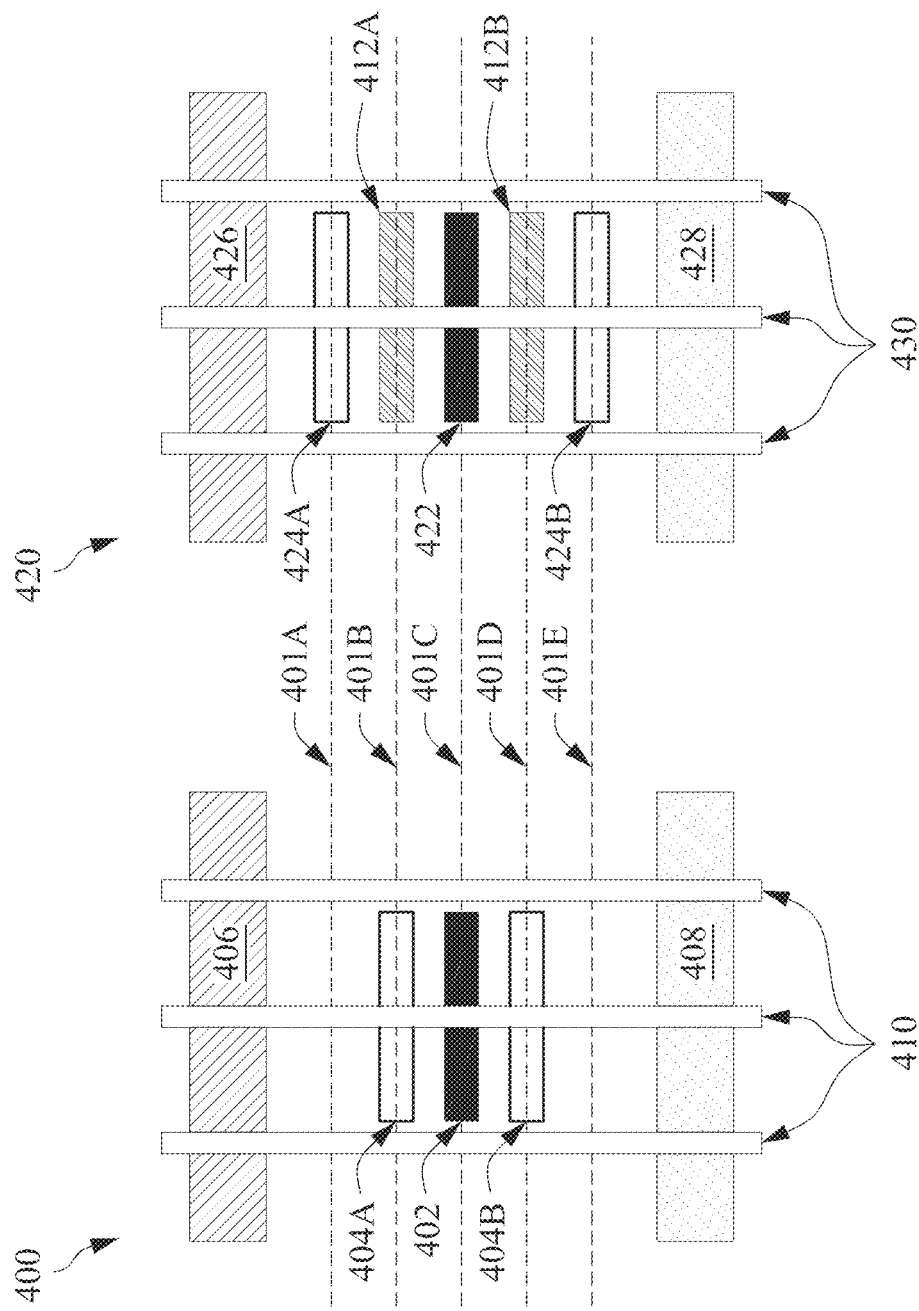

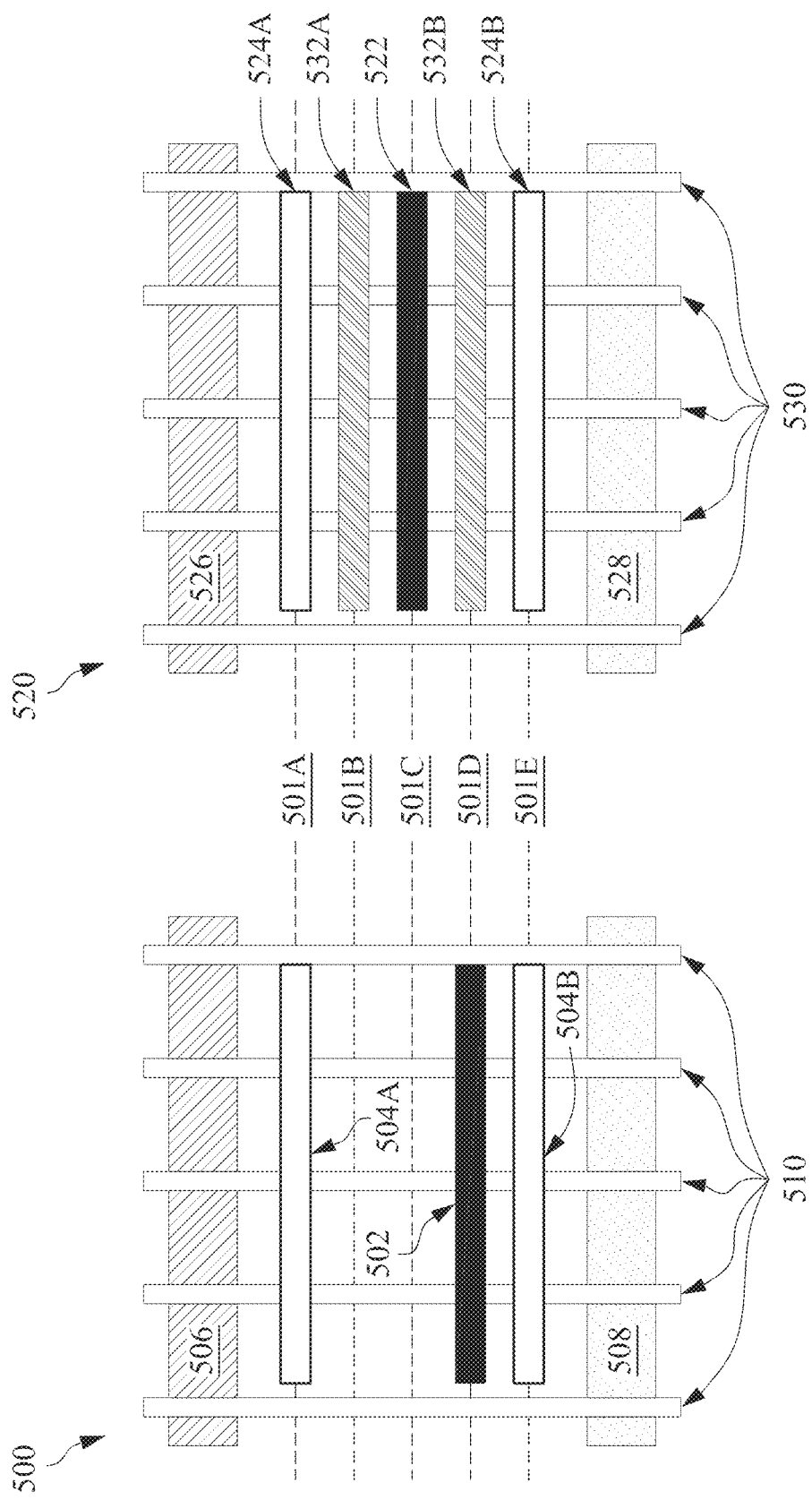

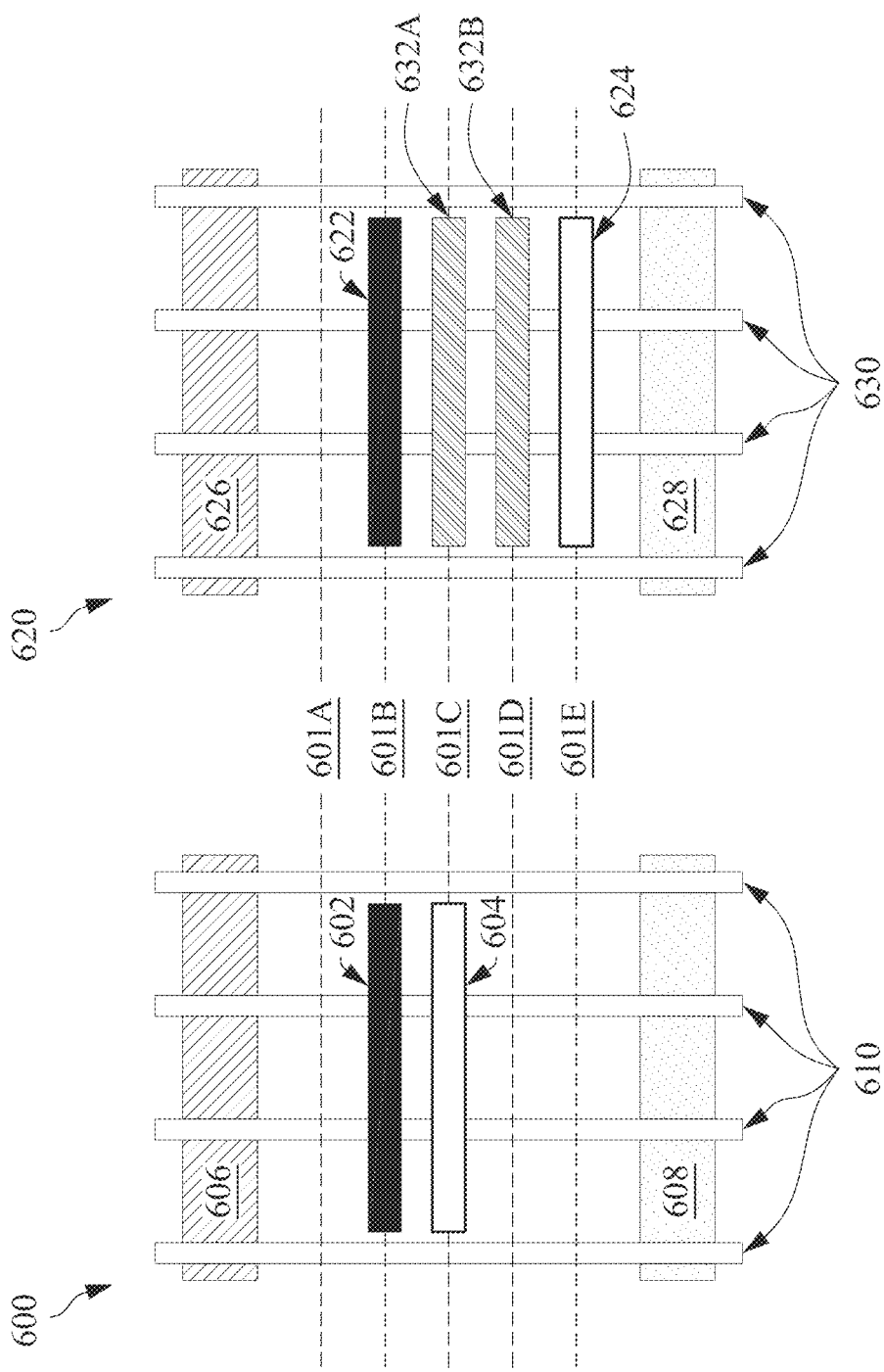

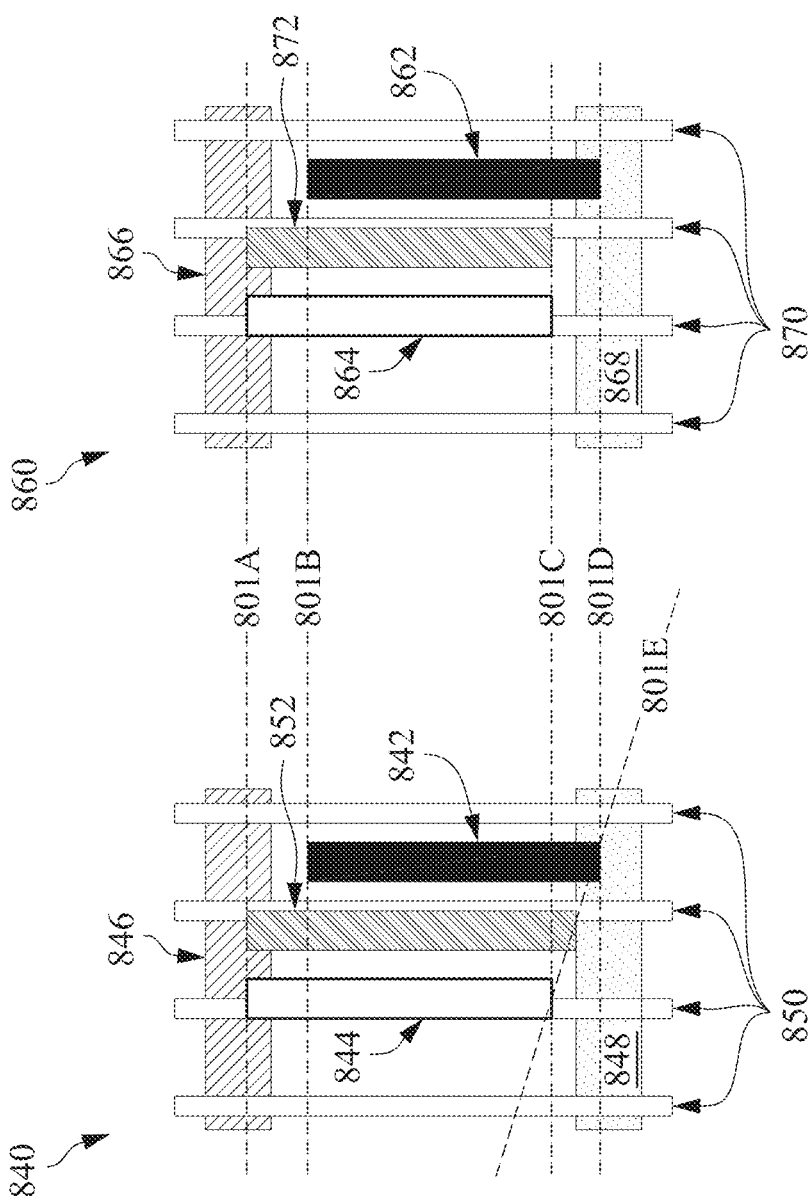

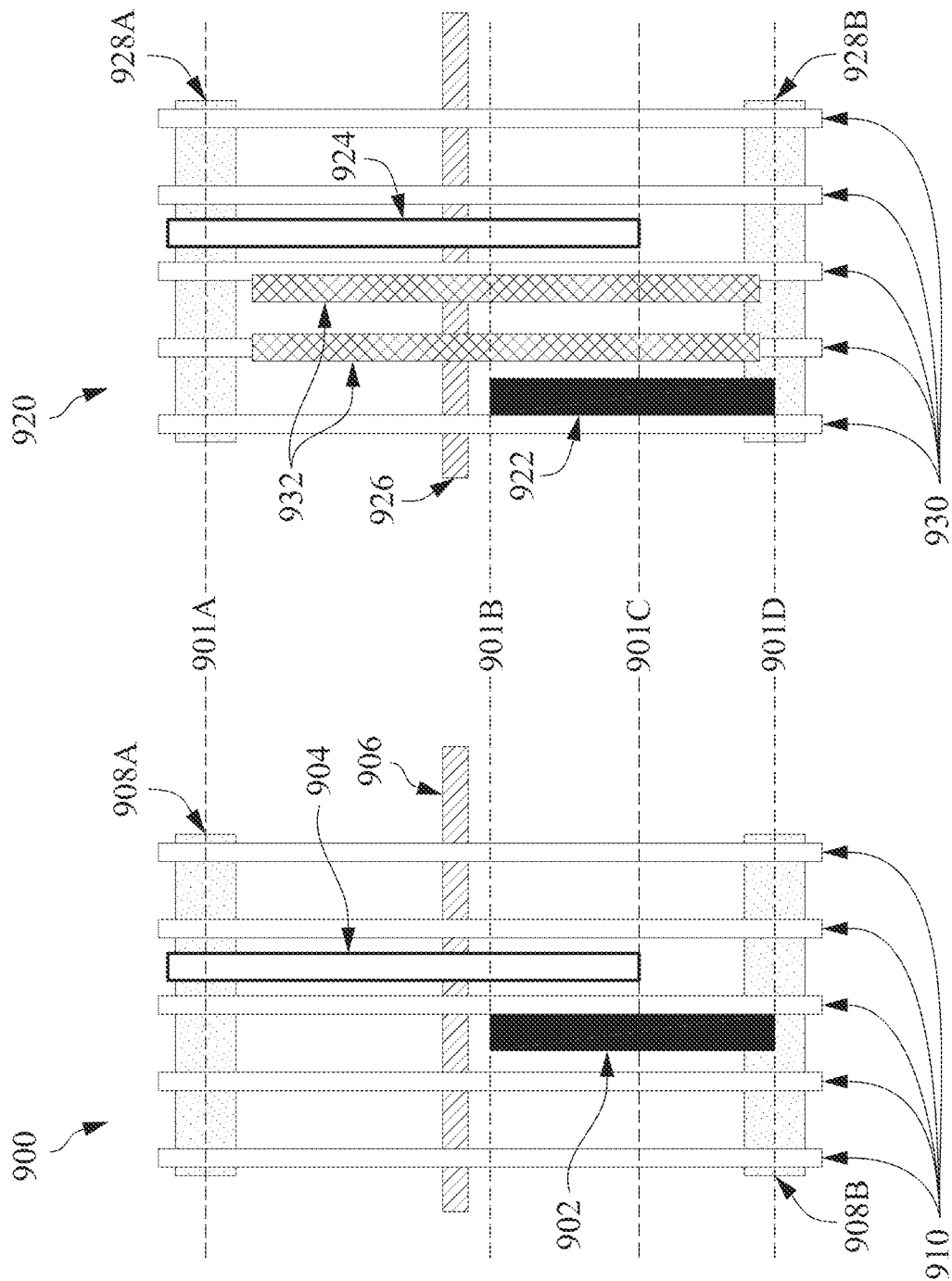

CAPACITIVE ISOLATION STRUCTURE INSERT FOR REVERSED SIGNALS

PRIORITY CLAIM

The present application is a continuation of U.S. application Ser. No. 17/195,133, filed Mar. 8, 2021, now U.S. Pat. No. 11,526,649, issued Dec. 13, 2022, which is a continuation of U.S. application Ser. No. 16/514,210, filed Jul. 17, 2019, now U.S. Pat. No. 10,943,050, issued Mar. 9, 2021, which claims the priority of U.S. Provisional Application No. 62/753,363, filed Oct. 31, 2018, which are incorporated herein by reference in their entireties.

BACKGROUND

Parasitic capacitance in an integrated circuit causes timing performance degradation and increased power consumption during operation of the integrated circuit. Parasitic capacitance in an integrated circuit occurs between adjacent conductive lines in an integrated circuit where one conductive line carries a voltage and the other line is at ground. Reducing parasitic capacitance improves circuit timing performance and decreases power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3F are schematic diagrams of an integrated circuit layout in accordance with some embodiments.

FIGS. 4A-4B are top views of an integrated circuit layout in accordance with some embodiments.

FIGS. 5A-5B are top views of an integrated circuit layout in accordance with some embodiments.

FIGS. 6A-6B are top views of an integrated circuit layout in accordance with some embodiments.

FIGS. 8A-8D are top views of an integrated circuit layout in accordance with some embodiments.

FIGS. 9A-9B are top views of an integrated circuit layout in accordance with some embodiments.

DETAILED DESCRIPTION

Figure 1A:
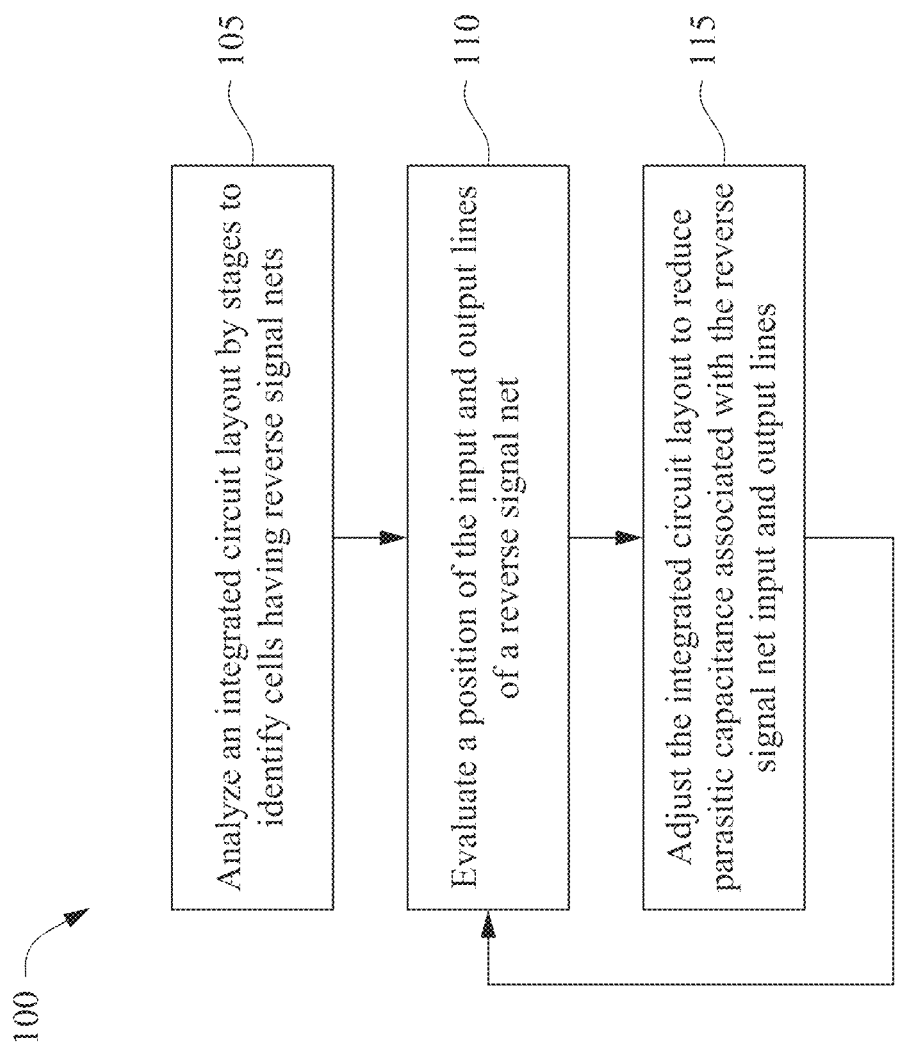
FIGS. 1A-1B are flow diagrams of a method of modifying an integrated circuit layout, in accordance with some embodiments.

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Parasitic capacitance in integrated circuits contributes to an increase in power consumption and a reduction in switching speed of the transistors of the integrated circuit, as compared to a similar integrated circuit with reduced the parasitic capacitance. In some embodiments, parasitic capacitance is associated with conductive features of the integrated circuit in close proximity to each other such that a capacitive effect occurs when one or both of the conductive features experiences a change in the electrical voltage carried through the circuit by at least one of the conductive features. Parasitic capacitance is reduced by decreasing the capacitive coupling of conductive features in an integrated circuit. Equation 1, below, is a formula that describes capacitance of parallel plates having an area A separated by a distance d:

$$C = \varepsilon_0 \frac{A}{d} \qquad \text{Equation (1)}$$

where C is the capacitance, in farads (F),

A is the area of overlap of the two plates, in square meters (m²), $\varepsilon_0$ is the dielectric constant of vacuum ($\varepsilon_0$ is approximately $8.854 \times 10^{-12}$ F/m), and d is the distance between the two plates, in meters (m).

In some instances, conductive lines of an integrated circuit extending in a same direction along routing tracks in a layer of an integrated circuit act as electrodes of a capacitor, where each conductive line is made of a metallic material, a semiconductor material, or another electron-carrying material, and is separated from other conductive lines within the layer of the integrated circuit by a dielectric material. A routing track, also called a track for purposes of the present disclosure, is a position in an integrated circuit or integrated circuit layout where a line of conductive material is able to be placed for electrically connecting components of the integrated circuit. An interval is the distance between tracks in a layout of an integrated circuit. In some instances, a cell of an integrated circuit layout has a cell length that corresponds approximately to an integer multiple of the interval in the cell.

A reverse signal net is a structure in an integrated circuit for which the input and the output are in opposite voltage states 100% of the time. In an embodiment, a simple reverse signal net is an inverter where, when the input has a "high" voltage, the output has a "low" voltage, or when the input has a "low" voltage, the output has a "high" voltage. The input and output of a reverse signal net tend to be in close proximity in an integrated circuit layout. If the input and output of a reverse signal net are on adjoining tracks in a level of the integrated circuit layout, the potential for parasitic capacitance is the greatest of the pairs of adjacent conductive lines in the integrated circuit layout because of the proximity and because of the constant "opposite voltage" situation between the input and output lines of the reverse signal net.

In some embodiments, the input of a reverse signal net is at least one of $V_{DD}$ or $V_{SS}$. In some embodiments, the output of a reverse signal net is at least one of $V_{DD}$ or $V_{SS}$. In some embodiments, input voltage $V_{in}=V_{DD}$ and output voltage $V_{out}=V_{SS}$. In some embodiments, input voltage $V_{in}=V_{SS}$ and output voltage $V_{out}=V_{DD}$. In some embodiments, the cell of the integrated circuit has multiple input lines and a single output line. In some embodiments, the cell of the integrated circuit has a single input line and at least one output line. In some embodiments, the cell of the integrated circuit includes a hierarchy (one or more) of inverters. In some embodiments, one of $V_{in}$ or $V_{out}$, is at a voltage level between $V_{DD}$ and $V_{SS}$.

When a conductive line such as an input line to a reverse signal net is at a first location or position in the integrated circuit layout, the conductive line is at a first position or at a first track. When the integrated circuit conductive line is moved to a new position or location in the integrated circuit layout, the conductive line is moved to a second position or a second track, where the second track is at least one track interval away from the first track. A track interval is a spacing in the integrated circuit, or integrated circuit layout, between adjacent tracks. In some embodiments, tracks are separated by regular track intervals. A dimension of a track interval is the same in some regions of the integrated circuit layout. In some embodiments, a track interval changes at different levels of the integrated circuit layout based on the dimensions of the conductive lines in the levels of the integrated circuit layout. As a distance from the substrate increases, a size of the conductive line and an interval between tracks increases, in some embodiments.

Parasitic capacitance between conductive lines in a single layer of the integrated circuit is directly proportional to an amount of overlap, in a direction perpendicular to the tracks, of the two conductive lines. Parasitic capacitance is inversely proportional to the distance between conductive lines (e.g., integer multiples of the pitch or interval between adjacent tracks in the layer of the integrated circuit where the conductive lines are located, although other line intervals are also contemplated). Parasitic capacitance in an integrated circuit increases when conductive features in proximity to each other have opposite conductive states, i.e., when a first conductive line carries a logically high voltage and a second conductive lines carries a logically low voltage.

When a circuit element is analyzed and the input and output are not in opposite states, the insertion or inclusion of an isolation metal track or capacitive isolation structure (CIS) between input and output conductive lines connected to the circuit element has a higher risk to increase, rather than reduce, parasitic capacitance of the integrated circuit in some operational states of the integrated circuit.

An integrated circuit layout having a reverse signal net with parasitic capacitance between the input and the output conductive lines to the reverse signal net at adjoining tracks in the cell has an initial or original capacitance of $C_O$ between the input line and the output line. An integrated circuit having a capacitive isolation structure between the input and output lines of the reverse signal net has a modified, or an equivalent parasitic capacitance $(C_{eq})$, as described in Equation 2, for a set of N of parallel conductive lines:

$$\frac{1}{C_{eq}} = \frac{1}{C_1} + \ldots + \frac{1}{C_N} \qquad \text{Equation (2)}$$

where $C_{eq}$=the equivalent parasitic capacitance between the reverse signal net input and output line after inserting a capacitive isolation structure between the input and output conductive metal lines;
$C_1$=the parasitic capacitance between the input line and a closest capacitive isolation structure; and
$C_N$=the parasitic capacitance between the output line and a closest capacitive isolation structure.

Insertion of at least one capacitive isolation structure between an input conductive line and an output conductive line of the reverse signal net decouples the input and output to reduce the overall parasitic capacitance between the input and output, as compared to a structure with similar spacing between input and output lines, and no capacitive isolation structure.

In some embodiments, parasitic capacitance is reduced by moving, at a design phase of preparing the integrated circuit layout or design, at least one of the input or output lines of a reverse signal net. A first separation distance is measured between the position of the input line and the output line of a reverse signal net experiencing parasitic capacitance. When one line (either the input line, or the output line) is moved, the moved line is at a new position in the integrated circuit layout, and a second separation distance is measured between the moved line and the unmoved line in the integrated circuit. In some embodiments, both the input line and the output line experiencing parasitic capacitance are moved, and the new or adjusted separation distance is larger than when only one of the conductive lines is moved to a new position or a new track in the integrated circuit layout.

In some embodiments, an empty track, i.e., a track with no conductive line, is left between the input and output conductive lines to have additional or continuous dielectric material separating the input and output conductive lines from each other. In some embodiments, one or more capacitive isolation structures are inserted between the input and output conductive lines of a reverse signal net. In some embodiments, the inserted one or more capacitive isolation structures are added symmetrically between the input and output lines of the reverse signal net. In some embodiments, the inserted one or more capacitive isolation structures are added asymmetrically between the input and output lines of the reverse signal net.

In some embodiments, the one or more capacitive isolation structures are floating capacitive isolation structures, electrically isolated from both $V_{DD}$ or $V_{SS}$. In some embodiments, the one or more capacitive isolation structures are tied to an intermediate voltage having a voltage between the input voltage to the reverse signal net, and the output voltage of the reverse signal net. In some embodiments, one or more of the capacitive isolation structures are tied to $V_{SS}$ of the integrated circuit. In some embodiment, one or more of the capacitive isolation structures are tied to $V_{DD}$ of the integrated circuit.

In accordance with some embodiments, a number N of intervals between the input and the output conductive lines has a value of at least 1, although larger values of N are also envisioned within the scope of the present disclosure. In some embodiments, the upper bound to the value of N is the total number of tracks ($N_{Tracks}$), as shown below:

$$N+1=N_{Tracks} \qquad \text{Equation (3)}$$

When the reverse signal net input and output conductive lines are separated from each other by two or more intervals with no capacitive isolation structures between the input and output conductive lines, the capacitance $C_0'$ measured (after separation) between the input and the output conductive lines is less than the original capacitance $C_0$ (before separation) between the input and the output of the reverse signal net, e.g., $C_0 > C'_0$.

FIG. 1A is a flow diagram of a method 100 of modifying an integrated circuit layout, in accordance with some embodiments. In an operation 105, the integrated circuit layout is analyzed by stages in order to identify reverse signal nets within the layout. In some embodiments, a stage is a single cell of an integrated circuit that receives an input and provides an output. In some embodiments, a stage is a group of cells operating together to manipulate signals in the integrated circuit in a coordinated fashion. As described above, a reverse signal net is a circuit element wherein the input and the output always have opposite voltage states. In some embodiments, a high-voltage state corresponds with $V_{DD}$. In some embodiments, a low-voltage state corresponds with $V_{SS}$. In some embodiments, a reverse signal net has an input with one of the high-voltage state ($V_{DD}$) or the low-voltage state ($V_{SS}$), and the output with the other of the high-voltage state ($V_{DD}$) or the low-voltage state ($V_{SS}$). In some embodiments, an integrated circuit has an intermediate voltage state between the high-voltage state and the low-voltage state. A reverse signal net integrated circuit has the input and the output lines constantly in "opposite" voltage states, according to the voltages that are supplied to the reverse signal net. In some embodiments, a reverse signal net is an inverter of a CMOS integrated circuit. In some embodiments, a reverse signal net includes a plurality of inverters with connected input and output lines.

During analysis of the integrated circuit layout, individual cells of the integrated circuit layout are identified as being part of reverse signal nets for subsequent operations of the method 100.

In an operation 110, for a reverse signal net of the integrated circuit identified in operation 105, the positions in the integrated circuit layout of the input lines and output lines of the reverse signal net are analyzed. In some embodiments, the input and output lines are on adjacent tracks of a cell of the integrated circuit layout. In some embodiments, the input and output lines of a reverse signal net are separated in a cell of the integrated circuit layout by at least one track. Whether the input and output lines are on adjacent tracks, or separated by at least one track, the input lines and output lines are evaluated for parasitic capacitance. When input lines and output lines experience parasitic capacitance above a parasitic capacitance threshold, the input and output lines are within a threshold distance and become candidates for line position adjustment during integrated circuit layout modification.

The design specifications of an integrated circuit are used to determine the acceptable amount of parasitic capacitance between conductive lines in the integrated circuit. For a given layout of an integrated circuit, the amount of parasitic capacitance varies with the actual operating voltage of the integrated circuit. In some embodiments, when an integrated circuit is overclocked, by increasing the operating voltage of the integrated circuit, the circuit layout, which had acceptable amounts of parasitic capacitance at a first, lower, operating voltage, has an unacceptable amount of parasitic capacitance at a second, higher, operating voltage of the integrated circuit. In some embodiments, the parasitic capacitance of conductive lines in an integrated circuit layout is determined using SPICE/RC modeling of the integrated circuit. The parasitic capacitance threshold is set based on design specifications of the integrated circuit. For example, a design switching speed and power consumption are utilized to determine a suitable parasitic capacitance threshold in order for the integrated circuit to operate as intended. The determined parasitic capacitance is determined based on a separation distance between input conductive lines and output conductive lines of reverse signal nets for comparison with the parasitic capacitance threshold.

In an operation 115, for each reverse signal net having input and output lines exceeding the parasitic capacitance threshold, the integrated circuit layout is modified in order to reduce the parasitic capacitance between the input and output lines of the reverse signal net. After operation 115, the method returns to operation 110 until each reverse signal net of the integrated circuit has a parasitic capacitance at or below the parasitic capacitance threshold.

Figure 1B:
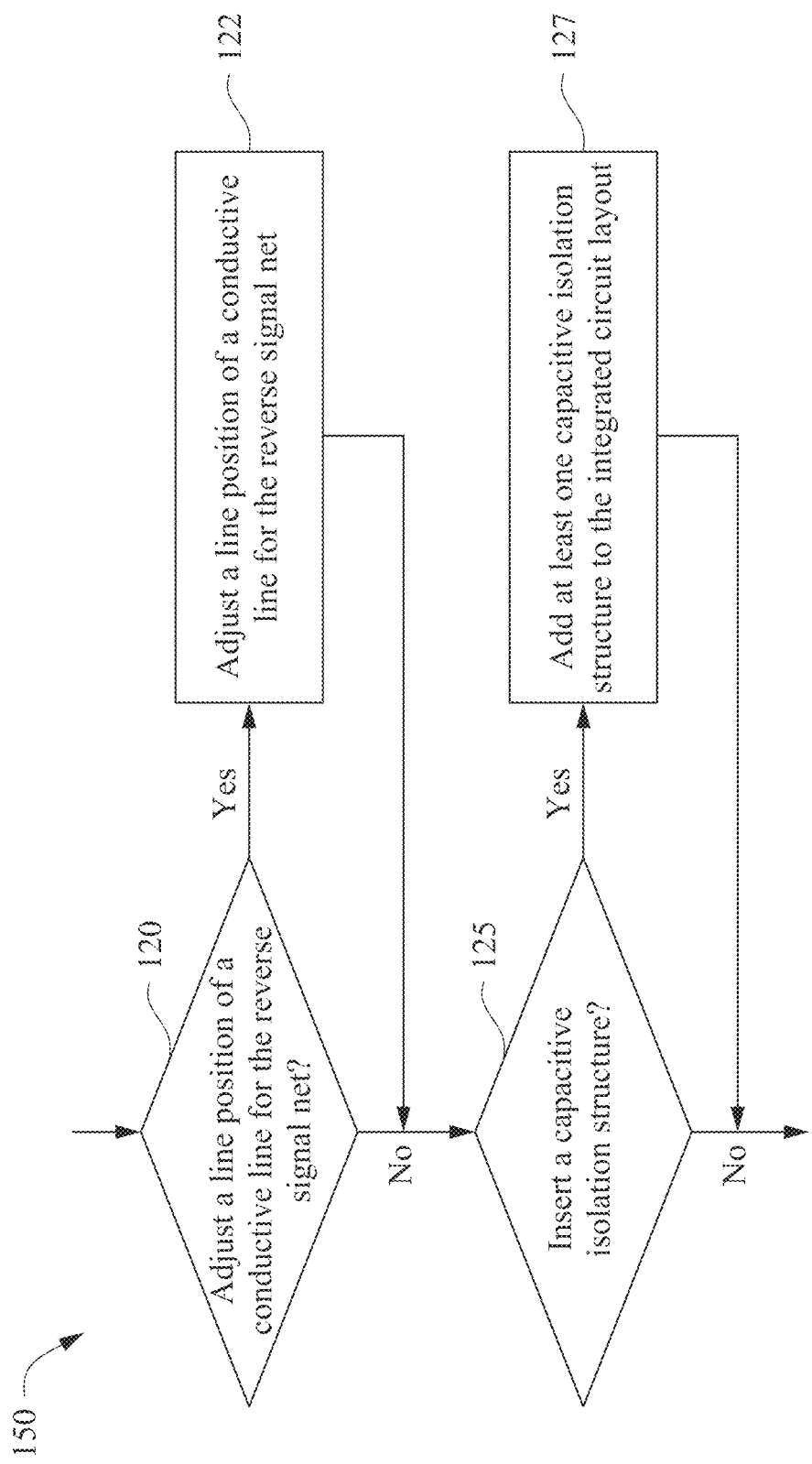

FIG. 1B is a flow diagram of method 150, further clarifying integrated circuit layout modification as described in operation 115. In an operation 120, a determination is made regarding whether to adjust a position of a conductive line in the integrated circuit layout. A determination for whether to adjust the position of the conductive line is based on at least one of an initial separation distance between conductive lines, available locations for moving the conductive line, routing complexity for the integrated circuit or priority of the reverse signal net in the integrated circuit. A large initial separation distance weighs against moving the position of a conductive lines because of an increased likelihood of the ability to add an additional element between the conductive lines of the reverse signal net to reduce the parasitic capacitance. A small number of available locations for moving the conductive line weighs against moving a conductive line because the options for moving the conductive line are limited. As routing complexity increases, moving a conductive line is less likely because of the impact on other levels of an interconnect structure if the conductive line is moved. A priority of the reverse signal net is related to the impact of the reverse signal net on the overall operation of the integrated circuit. As the priority of the reverse signal net decreases, the likelihood of moving a conductive line of the reverse signal net decreases because the increased time in modifying the layout outweighs the small improvement in performance of the integrated circuit. In some embodiments, higher priority reverse signal nets are identified; and the layout is modified based on this identified priority. If a conductive line position is to be moved within the integrated circuit layout, the method 150 continues in operation 122. If no conductive line position is to be moved within the integrated circuit layout, the method 150 continues in operation 125.

In operation 122, the line position of one or more of an input line and an output line of the reverse signal net in the integrated circuit is moved to a different track within the integrated circuit as part of integrated circuit modification, and the method 150 continues in operation 125. In some embodiments, an entirety of the conductive line is moved from the initial track to the different track. In some embodiments, less than an entirety of the conductive line is moved from the initial track to the different track.

In operation 125, a determination is made whether to add one or more isolation structures into the integrated circuit layout between input and output lines of a reverse signal net in order to reduce parasitic capacitance for the reverse signal net. A determination for whether to insert a capacitive isolation structure is based on at least one of a separation distance between the conductive lines or manufacturing complexity. A large initial separation distance weighs towards inserting a capacitive isolation structure because of ease of manufacturing processes to add the capacitive isolation structure. As manufacturing complexity increases, inserting a capacitive isolation structure is less likely because of the increased cost and risk for manufacturing error. As noted above, in some embodiments, reverse signal nets are analyzed based on priority of impact on the operation of the integrated circuit. If one or more isolation structures are to be added to the integrated circuit layout, the method 150 continues to operation 127. If no isolation structure are to be added to the integrated circuit layout, the method 150 continues to operation 110 (see method 100), where the layout is adjusted which will change the arrangement of conducive lines in the reverse signal net as part of the overall layout modification. In some embodiments, a capacitive isolation structure is added to the integrated circuit layout, wherein the capacitive isolation structure is a floating or a dummy isolation structure. In some embodiments, the isolation structure added to the integrated circuit layout is additional dielectric material at a position between the input and output lines to the reverse signal net.

In operation 127, at least one capacitive isolation structure is inserted into the integrated circuit layout. In some embodiments, adding a capacitive isolation structure to the integrated circuit layout includes steps associated with determining at least one location for the at least one capacitive isolation structure in the integrated circuit layout. In some embodiments, operation 127 includes steps associated with determining a type of capacitive isolation structure to be at the at least one location for adding capacitive isolation structures. In some embodiments, each of the one or more capacitive isolation structures added to an integrated circuit layout is a same type of capacitive isolation structures. In some embodiments, the one or more capacitive isolation structures are not all the same type of capacitive isolation structures. In some embodiments, the isolation structure is a floating isolation structure. In some embodiments, the isolation structure is a dummy isolation structure. In some embodiments, the isolation structure is an additional dielectric material in the layer of the integrated circuit. In some embodiments, the location for each of the one or more capacitive isolation structure added to an integrated circuit layout is on a track of the integrated circuit layout, separated by an integer multiple of the regular interval between adjacent capacitive integrated structures and/or input or output lines along a first direction between the input line and output line of the reverse signal net undergoing parasitic capacitance reduction.

In some embodiments, the insertion of an isolation structure into an integrated circuit layout further comprises determining a line position for ends of the isolation structure. In some embodiments, the inserted capacitive isolation structure aligns with the farthest ends of the conductive lines (input line and output line) closest to the isolation structure (see, e.g., FIG. 8B, element 832). In some embodiments, the inserted isolation structure aligns with a farthest end of one conductive line, and a non-parallel line-end position at the other end of the isolation structure (see, e.g., FIG. 8C, element 852). In some embodiments, the isolation structure fully aligns with line ends for one of the conductive lines, and does not align line ends with the other of the conductive lines (see, e.g., FIG. 8D, element 872). s Tracks in an integrated circuit layout run parallel to each other and have a uniform spacing or interval between adjacent tracks.

In some embodiments, tracks in a first region of an integrated circuit and tracks in a second region of an integrated circuit align with each other. In some embodiments, tracks in a first region of an integrated circuit and tracks in a second region of an integrated circuit do not align with each other. In some embodiments, tracks and a first region are perpendicular to tracks in a second region of the integrated circuit. In some embodiments, tracks in a second region of an integrated circuit are at an angle other than 0° or 90° to the tracks in the first region.

After completion of the integrated circuit layout adjustment as described hereinabove, an integrated circuit is manufactured with at least one of the integrated circuit layouts adjusted to reduce parasitic capacitance (see, e.g., FIG. 12).

Figure 2:
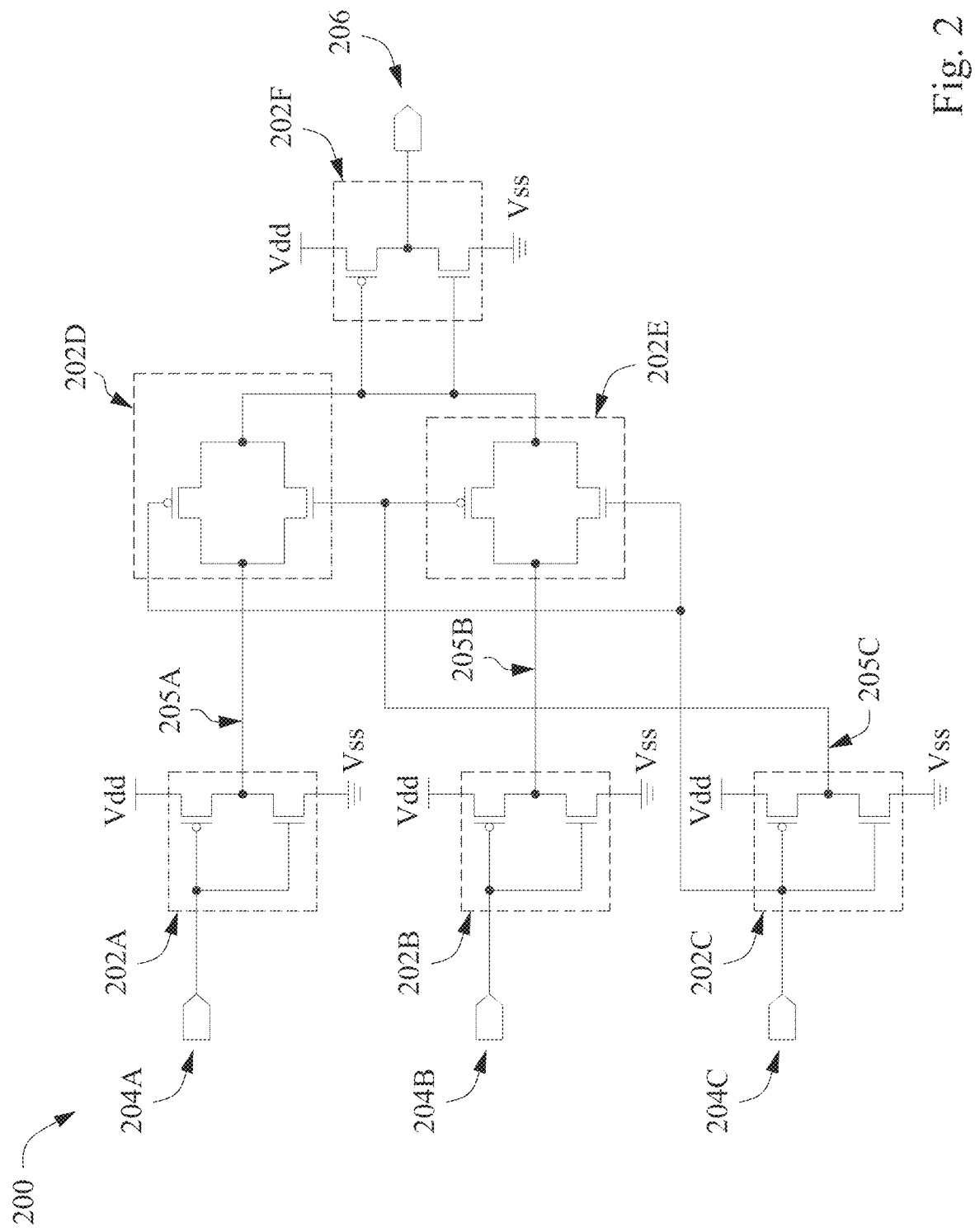
FIG. 2 is a schematic diagram of a reverse signal net in an integrated circuit layout, in accordance with some embodiments.

FIG. 2 is a schematic diagram of an integrated circuit 200 including reverse signal nets, in accordance with some embodiments. Integrated circuit 200 includes a plurality of inverters 202A-F, where the input and output are always the same signal nets, configured to direct a series of inputs 204A-C into an output 206. Inputs 204A-C and intermediate outputs 205A-C are at opposite voltage states from each other. Input stages of the integrated circuit 200 include inverters 202A-C. An output stage of the integrated circuit 200 is the inverter 202F. Intermediate inverters 202D-E are intermediate stages of the integrated circuit 200 and perform a logic switching function for the integrated circuit based on the voltage applied to the p-doped field emission transistor (PFET) and N-doped field emission transistor (NFET) of the intermediate inverters 202D-E. The inputs to each stage, and the outputs from each stage, are analyzed independently (see FIG. 1A, operation 105) to determine when parasitic capacitance interferes with the performance of an integrated circuit. Integrated circuit 200 includes input 204A and output 205A as an example of a reverse signal net because a voltage of input 204A is always logically opposite to a voltage of output 205A. Similarly, input 204B and output 205B define a reverse signal net; and input 204C and 205C define a reverse signal net. Input 204A and output 205B do not form a reverse signal net because the voltage of input 204A is not necessarily logically opposite to a voltage of output 205B. When parasitic capacitance is found to reduce the performance of an integrated circuit below design thresholds, the conductive lines of identified reverse signal nets are modified prior to manufacture of the integrated circuit to mitigate and/or reduce the amount of parasitic capacitance in the reverse signal net of the integrated circuit.

Figure 3C:
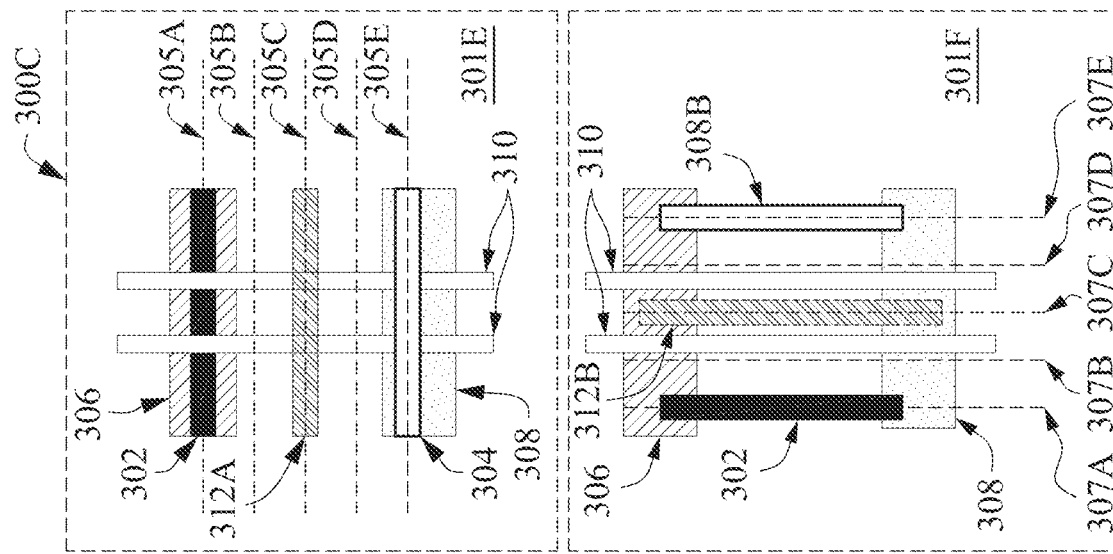

FIGS. 3A-3F are schematic diagrams of integrated circuit layout 300A-300F, in accordance with some embodiments. Elements of FIGS. 3A-3F that are the same are given identical element identifiers for clarity, despite differences in the individual cells 301A-301L. FIG. 3A is a schematic diagram of a first integrated circuit layout 300A, in accordance with some embodiments. First integrated circuit layout 300A includes a "horizontal" cell 301A and a "vertical" cell 301B. In horizontal cell 301A, the conductive lines (see, e.g., conductive lines 302, 304, 308 of FIG. 3A) are on, or aligned with, tracks that extend in a direction perpendicular to the poly lines 310. In vertical cell 301B, the conductive lines (see, e.g., conductive lines 302, 304, and 308) are on, or aligned with, tracks that extend in a direction parallel to the poly lines 310. Each of horizontal cell 301A and vertical 301B has an input line 302 for a reverse signal net, and an output line 304 for the reverse signal net, a diffusion region 306 and a diffusion region 308. A diffusion region is a P-doped or an N-doped region of a transistor, according to some embodiments. In some embodiments, the P-doped region is a source of a transistor. In some embodiments, the P-doped region is a drain of a transistor. In some embodiments, the N-doped region is a source or drain of a transistor. Poly lines 310 traverse a distance between diffusion regions 306 and 308. In horizontal cell 301A, and other horizontal cells (301C, 301E, 301G, 301I and 301K) described herein, tracks 305A-E extend in a direction perpendicular to the length of the poly lines 310. In vertical cell 301B, and other vertical cells (301D, 301F, 301H, 301J and 301L) described herein, tracks 307A-E extend in a direction parallel to the length of the poly lines 310.

In horizontal cell 301A, input line 302 and output line 304 of a reverse signal net are on adjacent tracks 305A and 305B and experience parasitic capacitance in excess of a parasitic capacitance threshold. Tracks 305C-E are empty tracks of the integrated circuit layout. In vertical cell 301B, input line 302 and output line 304 are on adjacent tracks 307A and 307B, and tracks 307C-E are empty tracks of the integrated circuit layout. As with horizontal cell 301A, input line 302 and output line 304 experience parasitic capacitance in excess of a parasitic capacitance threshold. Thus, for each of horizontal cell 301A and vertical cell 301B, at least one of the input line or the output line 304 is a candidate for movement during an integrated circuit layout adjustment process as described above in operation 115 (or, in operations 120-127).

FIG. 3B is a schematic diagram of a second integrated circuit layout 300B, in accordance with some embodiments. In comparison with horizontal cell 301A and vertical cell 301B, horizontal cell 301C and vertical cell 301D include the output line 304 moved to a new track. Output line 304 is moved to track 305E in horizontal cell 301C, and to track 307E in vertical cell 301D in order to reduce parasitic capacitance of the reverse signal net of the integrated circuit, in at least accordance with the disclosure of FIG. 1, operations 120-122. By moving a conductive line of a reverse signal net to a new track, a larger amount of dielectric material lies between the input line 302 and the output line 304, such that the increased distance and greater amount of dielectric material reduces the capacitive coupling between the input line 302 and the output line 304, lowering the parasitic capacitance during operation of the cell in the integrated circuit. In some embodiments, input line 302 is moved instead of output line 304. In some embodiments, output line 304 is moved to a different track, e.g., 305C, 305D, 307C or 307D, in order to minimize re-routing in other levels of an interconnect structure of the integrated circuit.

FIG. 3C is a schematic diagram of a third integrated circuit layout 300C, in accordance with some embodiments. Horizontal cell 301E is a modification of the layout of horizontal cell 301C in FIG. 3B, wherein a capacitive isolation structure 312A has been added to the horizontal cell 301E. Capacitive isolation structure 312A extends in a direction parallel to input line 302 and output line 304, and parallel to the tracks 305A-E of the horizontal cell 301E. In some embodiments, capacitive isolation structure 312A or capacitive isolation structure 312B is a floating metal line. In some embodiments, capacitive isolation structure 312A or capacitive isolation structure 312B is an irrelative line. A floating metal line is a metal line deposited in a layer of an integrated circuit, but not connected to conductive elements in other layers of the integrated circuit. Thus, a floating metal line acts as an electrically isolated capacitive buffer between an input line and an output line such as input line 302 and output line 304. An irrelative line is a conductive line in a layer of an integrated circuit which is connected to a voltage supply of the integrated circuit. In some embodiments, an irrelative line is connected to $V_{DD}$. In some embodiments, an irrelative line is connected to $V_{SS}$. In some embodiments, an irrelative line is connected to a conductive line with a voltage between $V_{DD}$ and $V_{SS}$.

Capacitive isolation structure 312A is situated at track 305C in horizontal cell 301E. Capacitive isolation structure 312B is situated at track 307C in vertical cell 301F. In some embodiments, a capacitive isolation structure is situated at or on a different track in a cell. In some embodiments, a capacitive isolation structure is situated between tracks of an integrated circuit layout. For example, in an embodiment where two empty tracks are located between an input line and an output line, a capacitive isolation structure is situated between the two empty tracks between the input line and the output line.

In FIG. 3C, horizontal cell 301E has a single capacitive isolation structure, capacitive isolation structure 312A, situated between input line 302 and output line 304 of the horizontal cell 301E. In vertical cell 301F, a single capacitive isolation structure, capacitive isolation structure 312B, is situated between input line 302 and output line 304 of vertical cell 301F. According to some embodiments, the capacitive isolation structure is located symmetrically between the input line and output line. According to some embodiments, the capacitive isolation structure between end of line and an output line located asymmetrically, e.g., on track 305B or track 307B, between the input line and output line of the cell. In some embodiments, multiple capacitive isolation structures are located between input line 302 and output line 304.

Figure 3D:
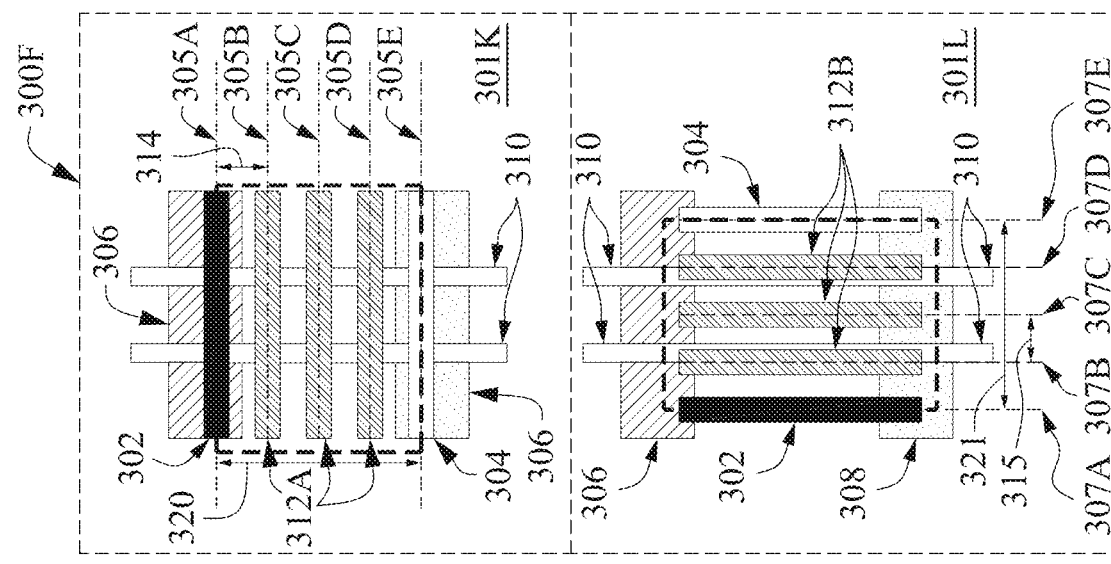

FIG. 3D is a schematic diagram of a fourth integrated circuit layout 300D, in accordance with some embodiments. FIG. 3D includes horizontal cell 301G and vertical cell 301H. In horizontal cell 301G, capacitive isolation structure 312A is located between input line 302 and output line 304. Input line 302 is at track 305A, output line 304 is at track 305C, and capacitive isolation structure 312A is at track 305B. Track 305A is at a first horizontal interval distance 314 from track 305B. Track 305C is at a second horizontal interval distance 316 from track 305A, where second horizontal interval distance 316 is twice as long as first horizontal interval distance 314. In vertical cell 301H, capacitive isolation structure 312B is at track 307B between input line 302 at track 307A and output line 306 at track 307C. Each track in vertical cell 301H is separated by a first vertical interval distance 315. Second vertical interval distance 317 is equal to two times the first vertical interval distance 315.

In horizontal cell 301G, capacitive isolation structure 312A is adjacent to input 302 and output line 304, unlike horizontal cell 301E, where an empty track 305B separates capacitive isolation structure 312A from each of the input and output lines.

Figure 3E:
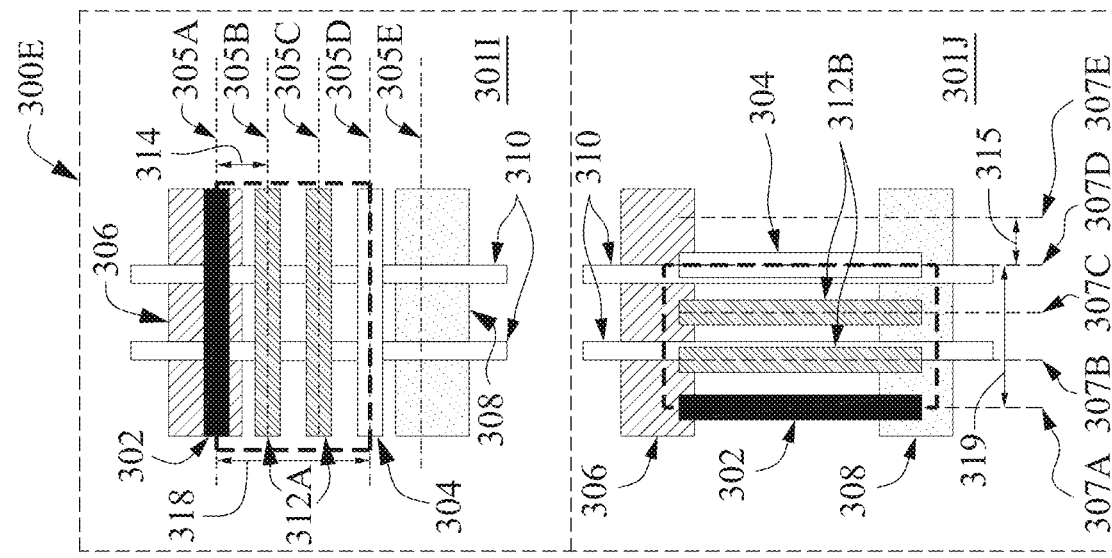

FIG. 3E is a schematic diagram of a fifth integrated circuit layout 300E, in accordance with some embodiments. FIG. 3E includes horizontal cell 301I and vertical cell 301J. In a horizontal cell 301I, input line 302 is at track 305A, output line 304 is at track 305D, and to capacitive isolation structures 312A are located at tracks 305B and 305C between the input line 302 and output line 304. Horizontal track interval 314 separates each of tracks 305A-E in a horizontal cell 301I. Horizontal track interval 318 is equal to three times the size of track interval 314. Each of capacitive isolation structures 312A in horizontal cell 301I is an interval distance 314 away from the nearest conductive line of the cell. Further, the capacitive isolation structures 312A are the same interval distance 314 from each other.

In vertical cell 301J, input line 302 is a first vertical interval distance 315 from the nearest capacitive isolation structure 312B, and output line 304 is a first vertical interval distance 315 from the nearest capacitive isolation structure 312B, and the two capacitive isolation structures are also a first vertical interval distance 315 apart from each other.

Figure 3F:
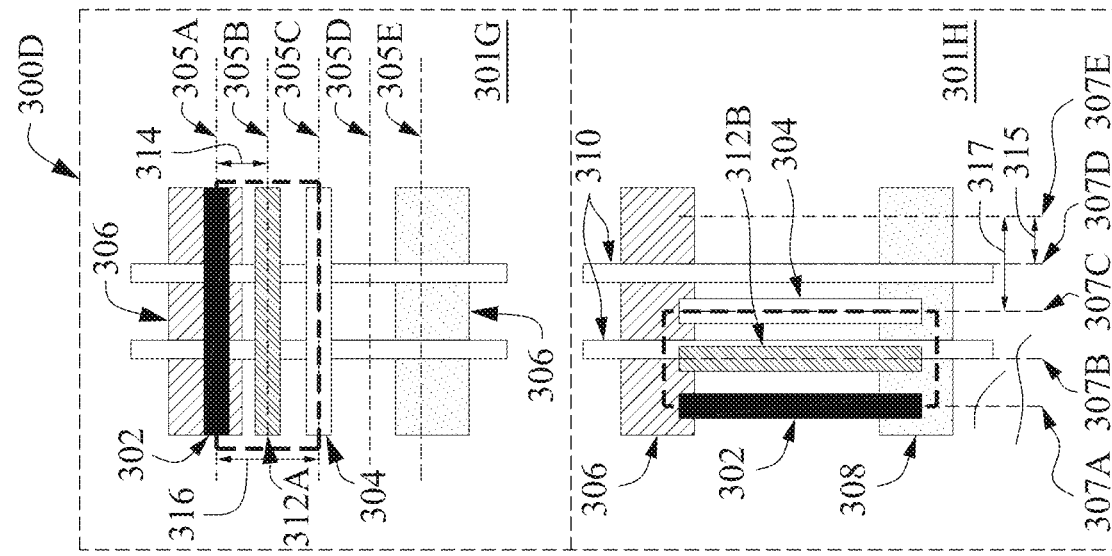

FIG. 3F is a schematic diagram of a sixth integrated circuit layout 300F, in accordance with some embodiments. FIG. 3F includes horizontal cell 301K and vertical cell 301L. In horizontal cell 301K, input line 302 is at track 305A, output line 304 is at track 305E, and capacitive isolation structures 312A are located at tracks 305B-305D. Each individual track 305A-305E is separated by a horizontal track interval 314. Input line 302 and output line 304 are separated by a track interval 320. Track interval 320 is equal to four times the length of horizontal track interval 314.

In a vertical cell 301L, input line 302 is located at track 307A, output line 304 is at track 307E, and capacitive isolation structures 312B are located at tracks 307B-307D. Each track 307A-307E separated from an adjacent track by vertical track interval 315, and input line 302 is separated from output line 304 by an interval 321, where interval equals for times the vertical track interval 315.

FIG. 4A is a top view of an integrated circuit layout 400 in accordance with some embodiments. In FIG. 4A, integrated circuit layout includes an input line 402 and two output lines 404A and 404B. Input line 402 is at track 401C, output line 404A is at track 401B, and output line 404B is at track 401D. Poly lines 410 extend across the cell from above diffusion region 406 to above diffusion region 408. Vertically, diffusion region 406 and diffusion region 408 are below poly lines 410, and poly lines 410 are below the conductive lines (input line 402 and output lines 404A-B). Input line 402 is immediately adjacent to output line 404A and output line 404B. Integrated circuit layout 400 has parasitic capacitance for the reverse signal net of input line 402 and output lines 404A-B exceeding a parasitic capacitance threshold. Thus, according to method 100, operation 115, as described above, output lines 404A-B are moved to new locations in the integrated circuit layout in order to reduce parasitic capacitance.

FIG. 4B is a top view of an integrated circuit layout 420 in accordance with some embodiments. Elements of integrated circuit layout 420 similar to elements of integrated circuit layout 400 have a same element identifier, incremented by 20 (e.g., input line 402 in FIG. 4A equivalent to input line 424 in FIG. 4B). Output line 424A is located at track 401A and output line 424B is located at track 401E. Capacitive isolation structure 412A is located at track 401B, and capacitive isolation structure for one to be is located at track 401D. Capacitive isolation structures between input line 422 and each of output lines 424A and 424B reduce parasitic capacitance of integrated circuit layout 420.

According to some embodiments, by adding capacitive isolation structures between an input line and two output lines results in a speed increase of at least 1.6%, and a reduction in consumed power by the integrated circuit of at least 1.9%. The extent of speed changes and power consumption changes is related to the particular circuit structure surrounding the location of the inserted capacitive isolation structures, in accordance with the present disclosure. While FIGS. 4A-4B are horizontal cells, one of ordinary skill in the art would understand that this description is applicable to vertical cells similar to FIGS. 4A-4B.

FIG. 5A is a top view of an integrated circuit layout 500 in accordance with some embodiments. In FIG. 5A, input line 502 is located at track 501D, and output lines 504A and 504B are at tracks 501A and 501E. Poly lines 510 extend from above diffusion region 506 to above diffusion region 508. Input line 502, being in proximity to output line 504B, suffers from parasitic capacitance above a parasitic capacitance threshold. Thus, reducing parasitic capacitance of the integrated circuit layout is accomplished by moving input line 502 to a new track in the integrated circuit layout 500.

FIG. 5B is a top view of an integrated circuit layout 520 in accordance with some embodiments. In FIG. 5B, elements of the integrated circuit layout 520 that are similar to elements of integrated circuit layout 500 are represented by element numerals which have been incremented by 20 (e.g., input line 502 in integrated circuit layout 500 corresponds to input line 522 in integrated circuit layout 520). In FIG. 5B, input line 522 is symmetrically located at track 501C between output line 524A at track 501A, and output line 524B at track 501E. Capacitive isolation structure 532A is located at track 501B between input line 522 and output line 524A. Capacitive isolation structure 532B is located at track 501D between input line 522 and output line 524B.

According to some embodiments, capacitive isolation structure 532A and capacitive isolation structure 532B are a same type of capacitive isolation structure. According to some embodiments, capacitive isolation structure 532A and capacitive isolation structure 532B are different types of capacitive isolation structures. According to some embodiments, capacitive isolation structures 532A and 532B are both irrelative net-type isolation structures. According to some embodiments, by insertion of irrelative net-type isolation structures between an input line and each of two output lines results in a speed increase of at least 0.6% and a reduction in power consumption of at least 2.4%. The extent of speed changes and power consumption changes is related to the particular circuit structure surrounding the location of the inserted capacitive isolation structures, in accordance with the present disclosure. While FIGS. 5A-5B are horizontal cells, one of ordinary skill in the art would understand that this description is applicable to vertical cells similar to FIGS. 5A-5B.

FIG. 6A is a top view of an integrated circuit layout 600 in accordance with some embodiments. In integrated circuit layout 600, input line 602 is located at track 601B and output line 604 is that track 601C. The electrodes 610 extend from above diffusion region 606 to above diffusion region 608. Input lines 602 and output line 604, being adjacent to each other, experience parasitic capacitance above a parasitic capacitance threshold because of the proximity between the two lines. To reduce parasitic capacitance in integrated circuit layout 600, one of input line 602 or output line 604 is movable according to method 100 operation 115.

FIG. 6B is a top view of an integrated circuit layout in accordance with some embodiments. Elements of integrated circuit layout 620 that resemble elements of integrated circuit layout 600 have an element identifier similar to the element identifier in integrated circuit layout 600, incremented by 20. In integrated circuit layout 620, output line 624 is located at track 601E, three track intervals away from input line 622. Capacitive isolation structures 632A and 632B, located at tracks 601C and 601D, separate input line 622 from output line 624. Capacitive isolation structures 632A and 632B are different types of capacitive isolation structures. Capacitive isolation structure 632A is a floating capacitive isolation structure, and capacitive isolation structure 632B is an irrelative-net type isolation structure. According to some embodiments, an embodiment of an integrated circuit layout having to different-type capacitive isolation structures between an input line and an output line of a reverse signal meant experience an increase in speed of at least 0.75% and a decrease in power consumption of at least 2.30%. While FIGS. 6A-6B are horizontal cells, one of ordinary skill in the art would understand that this description is applicable to vertical cells similar to FIGS. 6A-6B.

Figures 7A, 7B:
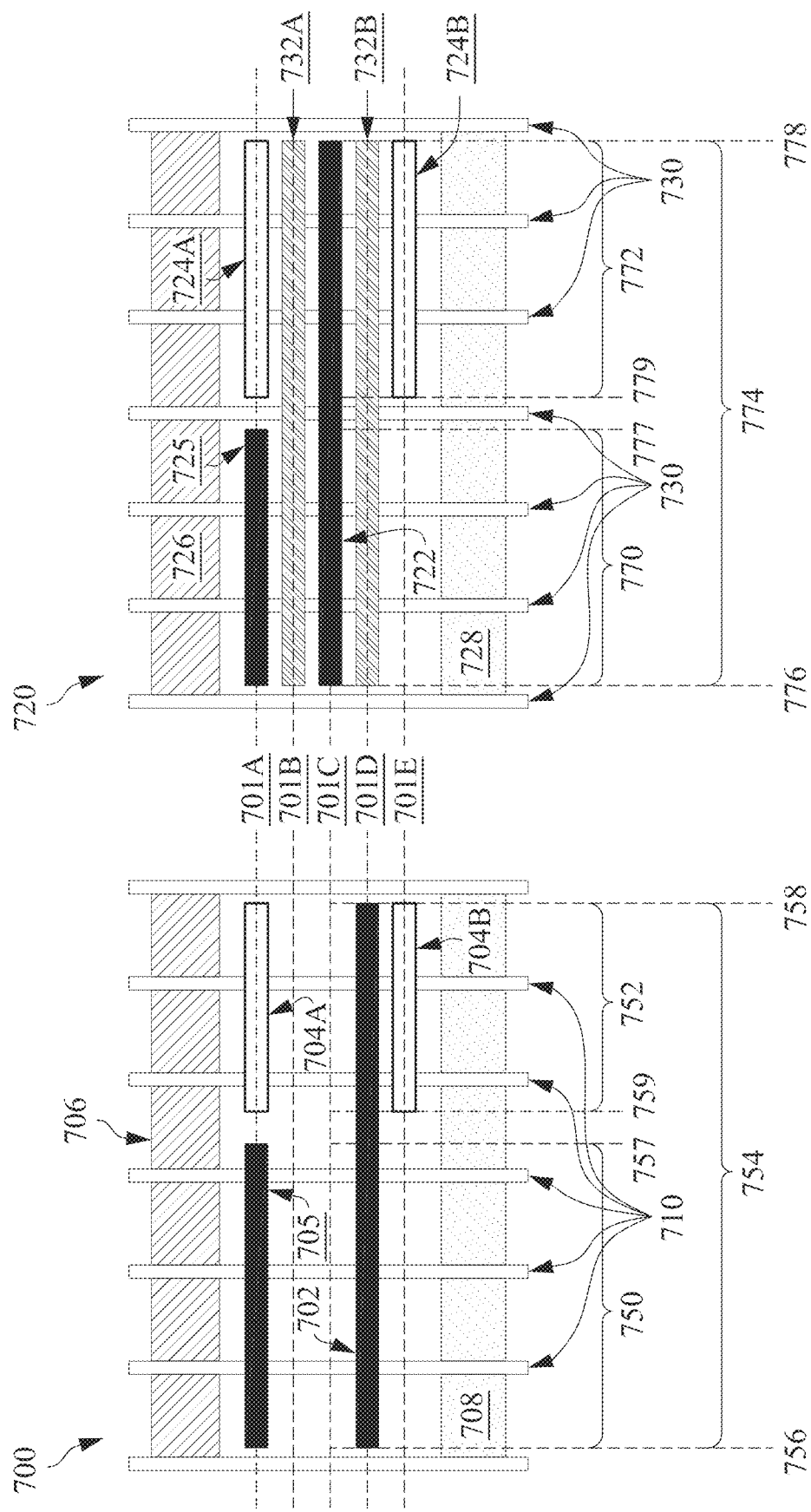
FIGS. 7A-7B are top views of an integrated circuit layout in accordance with some embodiments.

FIG. 7A is a top view of an integrated circuit layout 700 in accordance with some embodiments. Input line 702 is located at track 701D, output line 704A is located at track 701A, output line 704B is located at track 701E. Input line 705 is located at track 701B, separated from output line 704A. Input line 702 has a line length 754 extending from position 756 to position 758. Input line 705 has a line length 750 extending from position 756 to position 757. Output line 704A and output line 704B have a line length 752 extending from position 758 to position 759. Integrated circuit layout 700 has parasitic capacitance above a parasitic capacitance threshold because of the proximity between input line 702 and output line 704B. To reduce parasitic capacitance in integrated circuit layout 700, input line 702 and output line 704B should be separated by moving one or both of the lines.

FIG. 7B is a top view of an integrated circuit layout 720 accordance with some embodiments. Elements of integrated circuit layout 720 that corresponds to elements of integrated circuit layout 700 have a same element identifier, incremented by 20. Thus, input line 722 in integrated circuit layout 720 corresponds to input line 702 in integrated circuit layout 700. In FIG. 7B, input line 722 is located at track 701C, output line 724A (corresponding to output line 704A) is at track 701A, and output line 724B (corresponding to output line 704B) is at track 701E.

Capacitive isolation structure 732A is at track 701B, and capacitive isolation structures 732B is at track 701D. While output line 724A and output line 724B have line length 772 extending from position 778 to 779, capacitive isolation structures 732A and 732B have line length 774, extending from position 776 to 778. According to some embodiments, the length of capacitive isolation structures separating an input line from an output line are different than the length of the output lines. According to some embodiments, the length of a capacitive isolation structure is greater than the length of the length of the output lines. According to some embodiments, the length of a capacitive isolation structure is equal to the length of the input line when the input line has a longer length than the output line in the integrated circuit layout.

According to some embodiments, isolation structure 732A and isolation structure 732B are irrelative net type isolation structures. According to some embodiments, adding irrelative-net type isolation structures between an input line having a first length and an output line having a second length, where the length of the output line is less than the length of the input line, results in an increase in switching speed of at least 2.6%, and a reduction in power consumption of at least 4.1%. While FIGS. 7A-7B are horizontal cells, one of ordinary skill in the art would understand that this description is applicable to vertical cells similar to FIGS. 7A-7B.

Figures 8A, 8B:
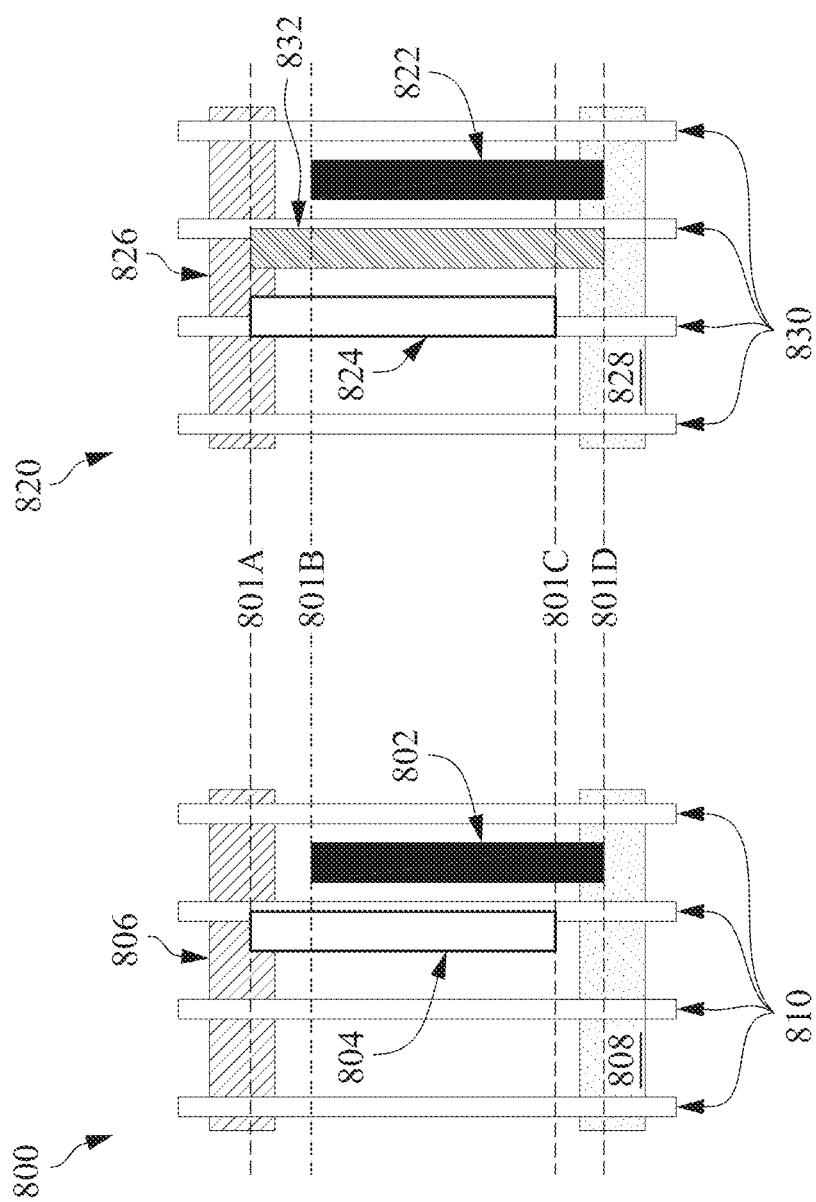

FIG. 8A is a top view of an integrated circuit layout 800 in accordance with some embodiments. In integrated circuit layout 800, the input line 802 extends from line position 801B above diffusion region 806 to line position 801B. Output line 804 extends from line position 801A to line position 801C above diffusion region 808. Input line 802 and output line 804 are unaligned, where the both ends of each of input line 802 and output line 804 do not align with either end of the other line. In some embodiments, an input line and an output line are partially unaligned, where one end of an input line aligns with one end of an output line (e.g., the lines share a line position) and the other ends of the lines are not aligned (e.g., the lines do not share a line position). Input line 802 and output line 804 experience parasitic capacitance above a parasitic capacitance threshold because of the proximity between input line 802 and output line 804. In order to reduce parasitic capacitance between input line 802 and output line 804, the integrated circuit layout 800 undergoes modification to change the position of one of input line 802 or output line 804.

FIG. 8B is a top view of an integrated circuit layout 820 in accordance with some embodiments. Elements of integrated circuit layout 820 that resemble elements of integrated circuit layout 800 are identified with an element identifier that resembles the identifier in integrated circuit layout, incremented by 20. Thus, input line 802 in integrated circuit layout 800 correlates to input line 822 in integrated circuit layout 820. In integrated circuit layout 820, input line 822 extends from line position 801B to line position 801D and output line 824 extends from line position 801A to line position 801C. Capacitive isolation structure 832 extends from line position 801A to line position 801D. Capacitive isolation structure 832 is a fully aligned capacitive isolation structure, extending from the farthest end of the input line (at line position 801A) and the farthest end of the output line (at line position 801D). Capacitive isolation structure 832 is an extended fully aligned capacitive isolation structure, where the capacitive isolation structure extends between the farthest line positions on each of the input line and the output line of the reverse signal net. According to some embodiments, an integrated circuit layout such as layout 820 experiences a speed increase of at least 1.05% and a power consumption decrease of at least 0.85% with an extended fully aligned capacitive isolation structure between an input line and an output line of a reverse signal net, as compared to an unmodified integrated circuit layout such as layout 800, described previously.

FIG. 8C is a top view of an integrated circuit layout 840 in accordance with some embodiments. Elements of integrated circuit layout 840 that resemble elements of integrated circuit layout 800 are identified with an element identifier that resembles the identifier in integrated circuit layout, incremented by 40. Thus, input line 802 in integrated circuit layout 800 correlates to input line 842 in integrated circuit layout 840. Integrated circuit layout 840 is a modified layout based on integrated circuit layouts 800 and 820, according to some embodiments. In integrated circuit layout 840, capacitive isolation structure 852 aligns with the ends of output line 844 at line position 801A, while the other end of capacitive isolation structure 852 aligns with ends of both input line 842 and output line 844 along line position 801E. Line position 801E extends from an end of the input line to an end of the output line and is not parallel to line positions 801A-D. Capacitive isolation structure 852 is a partially aligned isolation structure, where only one end of the capacitive isolation structure aligns with a conductive line (e.g., input line 842 or output line 844) at a parallel line position (e.g., one of line positions 801A-D).

FIG. 8D is a top view of an integrated circuit layout 860 in accordance with some embodiments. Elements of integrated circuit layout 860 that resemble elements of integrated circuit layout 800 are identified with an element identifier that resembles the identifier in integrated circuit layout, incremented by 60. Thus, input line 802 in integrated circuit layout 800 correlates to input line 862 in integrated circuit layout 860. Capacitive isolation structure 872 is aligned with the ends of output line 864 at line position 801A and line position 801C. Capacitive isolation structure 872 is a shortened fully aligned capacitive isolation structure, where the capacitive isolation structure is the same length as the output line 864. In some embodiments, the capacitive isolation structure is a same length as the input line that adjoins the capacitive isolation structure in the layer of the integrated circuit layout. Capacitive isolation structures 872 and 852 are less effective at reducing parasitic capacitance of an input and output to an reverse signal net than capacitive isolation structure 832 because capacitive isolation structure 832 provides more complete coverage between the input line 822 and output line 824 than for capacitive isolation structure 852 (with respect to input line 842 and output line 844) and capacitive isolation structure 872 (with respect to input line 862 and output line 864). While FIGS. 8A-8D are horizontal cells, one of ordinary skill in the art would understand that this description is applicable to vertical cells similar to FIGS. 8A-8D.

FIG. 9A is a top view of an integrated circuit layout 900 in accordance with some embodiments. In integrated circuit layout 900, the input line 902 overlaps output line 904. Output line 904 extends over diffusion region 906, while output line 904 extends over diffusion region 908b. Poly lines 910 extend from over diffusion region 906 to over diffusion regions 908A and 908B. Input line 902 and output line 904 are unaligned conductive lines, and experience parasitic capacitance above a parasitic capacitance threshold due to proximity in the integrated circuit layout 900. To reduce parasitic capacitance one or more of the input line and output line are moved in an adjusted integrated circuit (see integrated circuit layout 920, below).

FIG. 9B is a top view of an integrated circuit layout 920 in accordance with some embodiments. In integrated circuit layout 920, circuit elements that correspond to elements previously identified in integrated circuit layout 900 are identified with an element identifier that is incremented by 20. Isolation structures 932 are additional dielectric material located between input line 922 and output line 924. In some embodiments, the dielectric material at isolation structures is the same dielectric material as a remainder of the dielectric material surrounding input line 922 and output line 924. In some embodiments, the dielectric material of isolation structures 932 is a different dielectric material than the dielectric material of the layer of the integrated circuit. Placing two or more isolation structures in a layer of the integrated circuit provides greater reduction in parasitic capacitance than when a single isolation structure is between an input line and an output line of a reverse signal net. According to some embodiments, an integrated circuit layout with two "empty track" or additional dielectric material isolation structures, similar to isolation structures 932 in layout 920, experiences an increase in switching speed of at least 0.51% and a decrease in power consumption of at least 1.05%. While FIGS. 9A-9B are horizontal cells, one of ordinary skill in the art would understand that this description is applicable to vertical cells similar to FIGS. 9A-9B.

The aspects of the adjustments to integrated circuit layouts described previously are incorporated into cell layout libraries for development of integrated circuits by SPICE/RC modeling of integrated circuit functions and design standards. The cell layout adjustments described herein are made at a design phase for an integrated circuit prior to a manufacturing process to form integrated circuit elements in a layer of an integrated circuit.

In accordance with some embodiments, capacitive isolation structures are added to an integrated circuit in combination and in sequence. A peak and an average value of a power consumption decrease, and of a switching speed increase, are given below. In some embodiments, a library of standard cells that undergo layout adjustment as described herein undergoes, for input lines and output lines of reverse signal nets in combination, an increase in speed of up to 5.25%, with an average increase of 1.62%, and a decrease in power consumption of up to 8.9%, with an average decrease in power consumption of 2.31% across cells of the library. In some embodiments, a library of standard cells that undergo layout adjustment as described herein undergoes, for input lines and output lines of reverse signal nets in sequence, a switching speed increase of up to 6.63%, with an average speed increase of 1.17%, and a decrease in power consumption of up to 6.46%, with an average decrease in power consumption of 0.89%.

Standard cells that undergo layout adjustment as described herein undergoes, for input lines and output lines of reverse signal nets in combination, an increase in speed of up to 5.23%, with an average increase of 1.03%, and a decrease in power consumption of up to 6.76%, with an average decrease in power consumption of 1.89% across cells of the library. In some embodiments, a library of standard cells that undergo layout adjustment as described herein undergoes, for input lines and output lines of reverse signal nets in sequence, a switching speed increase of up to 1.39%, with an average speed increase of 0.32%, and a decrease in power consumption of up to 1.25%, with an average decrease in power consumption of 0.28%.

In some embodiments, the conductive material is selected from one or more of tungsten, cobalt, titanium, tantalum, palladium, platinum, ruthenium metal, or alloys thereof, or other materials conducive to semiconductor device manufacturing schemes. In some embodiments, the dielectric material is a material selected from silicon dioxide, silicon nitride, silicon-oxy-nitride, a low-κ dielectric material, a porous insulator material, or some other dielectric material used in a semiconductor manufacturing scheme.

A technique for reducing parasitic capacitance in an integrated circuit is to place isolating features between the conductive features that coupled to each other. One type of isolation feature is an insertion metal structure. An insertion metal structure is a metal line formed within a same layer of an integrated circuit as conductive lines that would couple with each other, were the insertion metal structure absent from the integrated circuit. An insertion metal structure is added to an integrated circuit between conductive lines that have opposite conductive status. For example, a NOT circuit element in an integrated circuit receives a first input and puts out a first output that is opposite of the first input. Thus, when a NOT circuit element receives a positive voltage is it input, the NOT circuit element puts out zero voltage output, and conversely, when the NOT circuit element receives a zero voltage input, the circuit element puts out a positive voltage output.

A capacitive isolation structure placed in an integrated circuit between circuit components that always have opposite voltage profile, or an "opposite" voltage status, such as the input and output of a NOT circuit element, has a consistent improvement on the overall performance of an integrated circuit because the parasitic capacitance is always reduced by the capacitive isolation structure. In the event that a capacitive isolation structure were to be added to a track between the input and output of an AND or an OR circuit element, some voltage profiles would have an improved parasitic capacitance, and some voltage profiles would have a deleterious effect on parasitic capacitance. A NOT circuit element has 100% "opposite" voltage profiles between input and output lines, while for a NOT or an OR circuit element, only 25% of the voltage profiles result in an "opposite" voltage profile, and 75% of the voltage profiles have at least one "same" voltage profile (where input and output voltage are both equal to the "high" voltage setpoint for the integrated circuit, or both equal to the "low" voltage setpoint for the integrated circuit).

According to some embodiments, a capacitive isolation structure is a grounded metal line situated between conductive lines with reversed or opposite conductive status. In some instances, the insertion metal structure has a floating voltage. Some integrated circuits employ an empty track (i.e., dielectric material) at the position where an insertion metal track structure would be located. In some embodiments, an insertion metal track structure is an irrelative net structure of the integrated circuit.

Integrated circuits with capacitive isolation structures have one or more metal isolation lines between conductive lines with opposite conductive status. For example, some integrated circuits include up to three isolation metal track structures between conductive lines with reversed voltage status in order to isolate the conductive lines from each other. Depending on the interval between the metal lines of the integrated circuit, an integrated circuit with multiple capacitive isolation structures can occupy the same amount of space as an integrated circuit with no isolation metal tracks, with less parasitic capacitance and higher switching speed.

Figure 10:
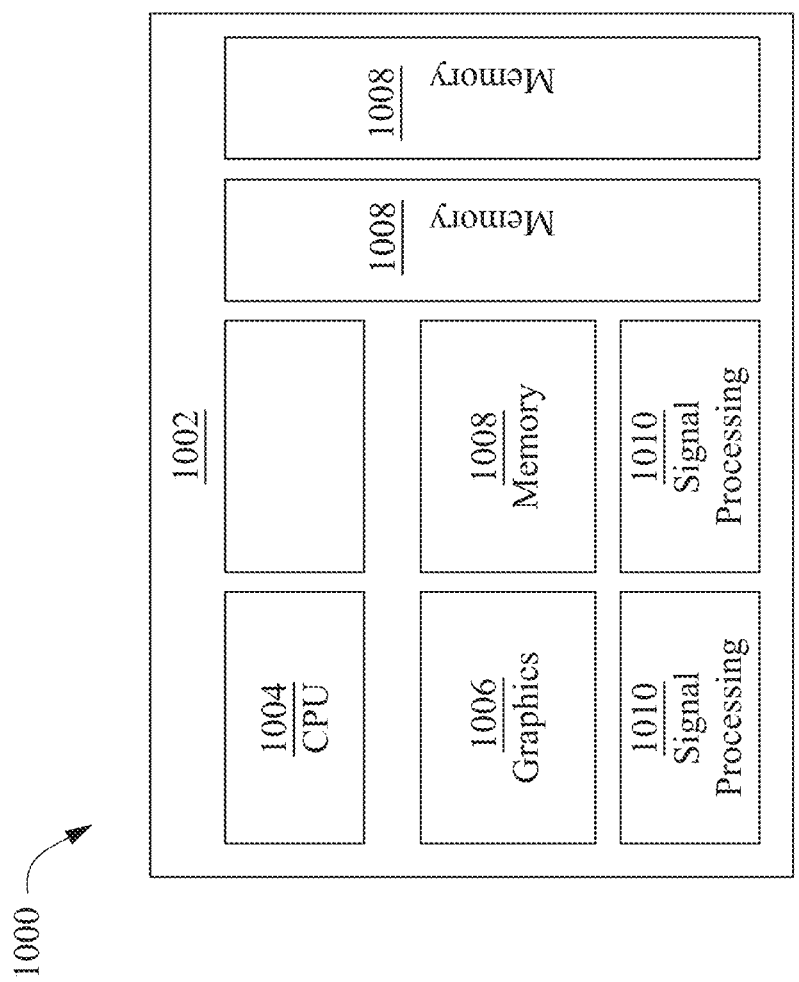
FIG. 10 is a block diagram of an integrated circuit, in accordance with some embodiments.

FIG. 10 is a schematic diagram of an integrated circuit layout 1000, according to some embodiments. Integrated circuit layout 1000 includes a circuit active area 1002 with transistors and other electrical circuit components. Circuit active area 1002 includes a central processing unit (CPU) area 1004, a graphics processing unit (GPU) 1006, one or more memory and/or data storage units 1008, and a signal processing unit 1010 that receives and modifies signals from sensors or other portions of the integrated circuit 1002.

Figure 11:
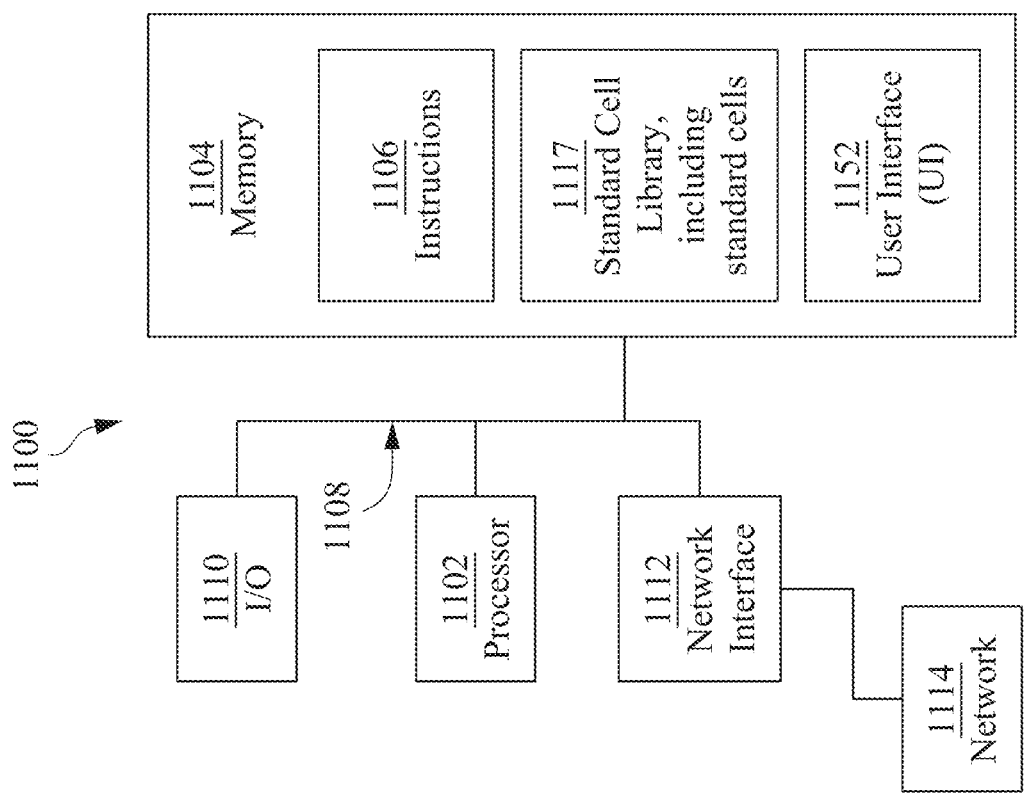
FIG. 11 is a flow diagram of a computer system containing an integrated circuit, in accordance with some embodiments.

FIG. 11 is a block diagram of an electronic design automation (EDA) system 1100, in accordance with some embodiments.

In some embodiments, EDA system 1100 includes an automated placement and routing (APR) system. Methods described herein of generating integrated circuit layout diagrams, in accordance with one or more embodiments, are implementable, for example, using EDA system 1100, in accordance with some embodiments.

In some embodiments, EDA system 1100 is a general purpose computing device including a hardware processor 1102 and a non-transitory, computer-readable storage medium 1104. Storage medium 1104, amongst other things, is encoded with, i.e., stores, computer program code 1106, i.e., a set of executable instructions. Execution of instructions 1106 by hardware processor 1102 represents (at least in part) an EDA tool which implements a portion or all of, e.g., the methods described herein in accordance with one or more (hereinafter, the noted processes and/or methods).

Processor 1102 is electrically coupled to computer-readable storage medium 1104 via a bus 1108. Processor 1102 is also electrically coupled to an I/O interface 1110 by bus 1108. A network interface 1112 is also electrically connected to processor 1102 via bus 1108. Network interface 1112 is connected to a network 1114, so that processor 1102 and computer-readable storage medium 1104 are capable of connecting to external elements via network 1114. Processor 1102 is configured to execute computer program code 1106 encoded in computer-readable storage medium 1104 in order to cause system 1100 to be usable for performing a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, computer-readable storage medium 1104 is an electronic, magnetic, optical, electromagnetic, infrared, and/or a semiconductor system (or apparatus or device). For example, computer-readable storage medium 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1104 includes a compact disk-read only memory (CD-ROM), a compact disk-read/write (CD-R/W), and/or a digital video disc (DVD).

In one or more embodiments, storage medium 1104 stores computer program code 1106 configured to cause system 1100 (where such execution represents (at least in part) the EDA tool) to be usable for performing a portion or all of the noted processes and/or methods. In one or more embodiments, storage medium 1104 also stores information which facilitates performing a portion or all of the noted processes and/or methods. In one or more embodiments, storage medium 1104 stores library 1117 of standard cells including such standard cells as disclosed herein.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

EDA system 1100 also includes network interface 1112 coupled to processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1100.

System 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. EDA system 1100 is configured to receive information related to a UI through I/O interface 1110. The information is stored in computer-readable medium 1104 as user interface (UI) 1152.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 12:
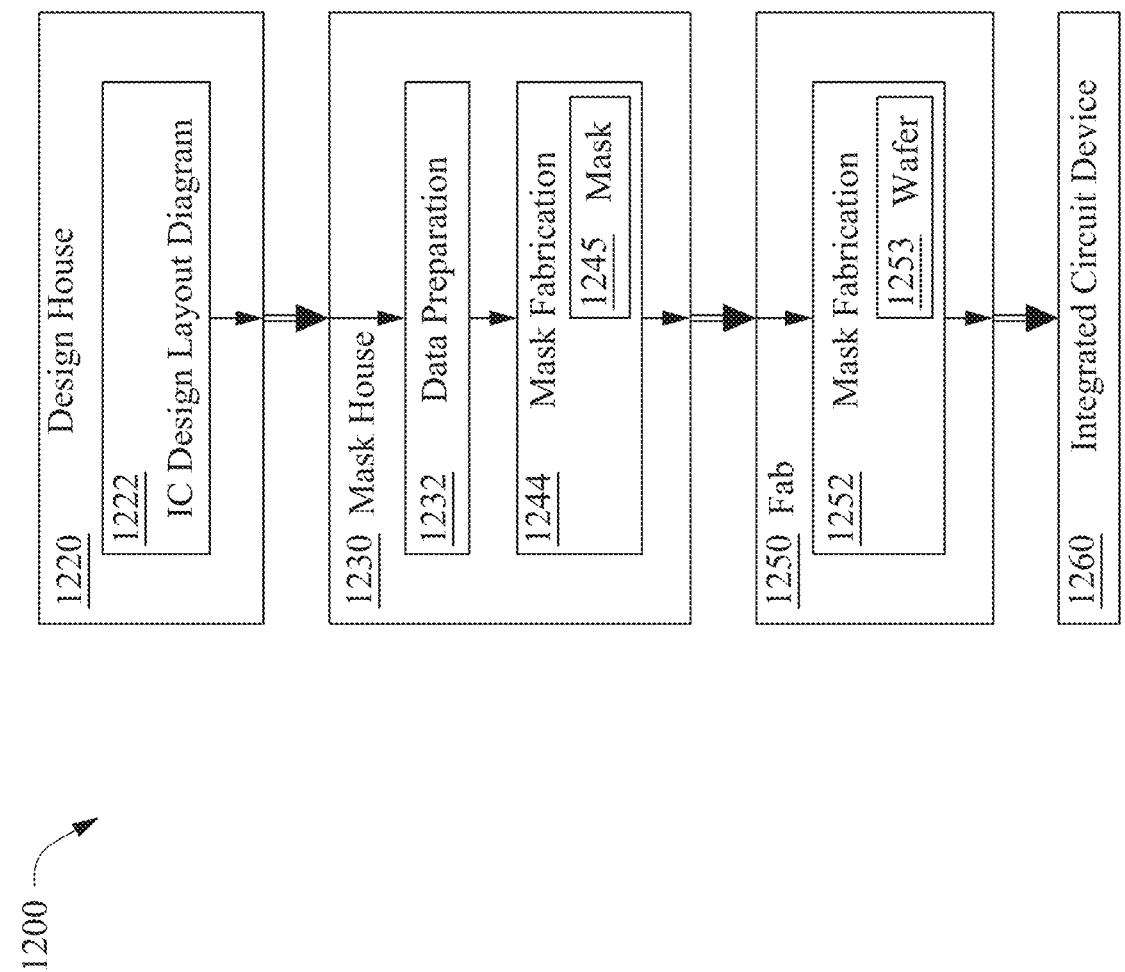
FIG. 12 is a flow diagram of a manufacturing process for an integrated circuit having metal isolation structures, in accordance with some embodiments.

FIG. 12 is a block diagram of an integrated circuit (IC) manufacturing system 1200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1200.

In FIG. 12, IC manufacturing system 1200 includes entities, such as a design house 1220, a mask house 1230, and an IC manufacturer/fabricator ("fab") 1250, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1250 is owned by a single larger company. In some embodiments, two or more of design house 1220, mask house 1230, and IC fab 1250 coexist in a common facility and use common resources.

Design house (or design team) 1220 generates an IC design layout diagram 1222. IC design layout diagram 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout diagram 1222 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout diagram 1222. The design procedure includes one or more of logic design, physical design or place and route. IC design layout diagram 1222 is presented in one or more data files having information of the geometrical patterns. For example, IC design layout diagram 1222 can be expressed in a GDSII file format or DFII file format.

Whereas the pattern of a modified IC design layout diagram is adjusted by a method such as Method 100, in order to reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 1230 includes data preparation 1232 and mask fabrication 1244. Mask house 1230 uses IC design layout diagram 1222 to manufacture one or more masks 1245 to be used for fabricating the various layers of IC device 1260 according to IC design layout diagram 1222. Mask house 1230 performs mask data preparation 1232, where IC design layout diagram 1222 is translated into a representative data file ("RDF"). Mask data preparation 1232 provides the RDF to mask fabrication 1244. Mask fabrication 1244 includes a mask writer. A mask writer converts the RDF to an image on a substrate, such as a mask (reticle) 1245 or a semiconductor wafer 1253. The design layout diagram 1222 is manipulated by mask data preparation 1232 to comply with particular characteristics of the mask writer and/or requirements of IC fab 1250. In FIG. 12, mask data preparation 1232 and mask fabrication 1244 are illustrated as separate elements. In some embodiments, mask data preparation 1232 and mask fabrication 1244 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout diagram 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout diagram 1222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1222 to compensate for limitations during mask fabrication 1244, which may undo part of the modifications performed by OPC in order to meet mask creation rules.

In some embodiments, mask data preparation 1232 includes lithography process checking (LPC) that simulates processing that will be implemented by IC fab 1250 to fabricate IC device 1260. LPC simulates this processing based on IC design layout diagram 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1222.

It should be understood that the above description of mask data preparation 1232 has been simplified for the purposes of clarity. In some embodiments, data preparation 1232 includes additional features such as a logic operation (LOP) to modify the IC design layout diagram 1222 according to manufacturing rules. Additionally, the processes applied to IC design layout diagram 1222 during data preparation 1232 may be executed in a variety of different orders.

After mask data preparation 1232 and during mask fabrication 1244, a mask 1245 or a group of masks 1245 are fabricated based on the modified IC design layout diagram 1222. In some embodiments, mask fabrication 1244 includes performing one or more lithographic exposures based on IC design layout diagram 1222. In some embodiments, an electron-beam (e-beam) or a mechanism of multiple e-beams is used to form a pattern on a mask (photomask or reticle) 1245 based on the modified IC design layout diagram 1222. Mask 1245 can be formed in various technologies. In some embodiments, mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1245 includes a transparent substrate (e.g., fused quartz) and an opaque material (e.g., chromium) coated in the opaque regions of the binary mask. In another example, mask 1245 is formed using a phase shift technology. In a phase shift mask (PSM) version of mask 1245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1244 is used in a variety of processes. For example, such a mask(s) is used in an ion implantation process to form various doped regions in semiconductor wafer 1253, in an etching process to form various etching regions in semiconductor wafer 1253, and/or in other suitable processes.

IC fab 1250 includes wafer fabrication 1252. IC fab 1250 is an IC fabrication business that includes one or more manufacturing facilities for the fabrication of a variety of different IC products. In some embodiments, IC Fab 1250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business. In some embodiments of the present disclosure, fin dimensional adjustment includes operations associated with making an array of fins across an entirety of the fin-containing functional areas of the integrated circuit, followed by modification of fin dimensions in at least one fin-containing functional area of the integrated circuit. In some embodiments of the present disclosure, the fins of different fin-containing functional areas are formed to a final fin shape or fin dimensional profile separately, in a single fin-formation manufacturing flow for each fin-containing functional area of the IC. In some embodiments, the fin dimension adjustment occurs by forming fins in a layer of fin material, or fin substrate, by applying mask layer to a top surface of the fin material, patterning the mask layer with a pattern that corresponds to the locations of fins in one or more of the fin-containing functional areas, exposing a top surface of the fin material through the mask layer, and etching the fin material to form fins in the fin substrate. In some embodiments, the fins are formed in a single functional area of the IC with a final fin dimension, the selected fin dimension (or, fin height) as described above in operation 740.

A patterned layer of mask material formed on a semiconductor substrate is made of a mask material that includes one or more layers of photoresist, polyimide, silicon oxide, silicon nitride (e.g., $Si_3N_4$), SiON, SiC, SiOC, or combinations thereof. In some embodiments, masks include a single layer of mask material. In some embodiments, a mask includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, fins of areas not covered by the mask, or fins in open areas of the pattern, are etched to modify a fin dimension. In some embodiments, the etching is performed on a top surface of fins with fin sides that are completely covered by adjoining dielectric support material deposited between fins in a previous manufacturing step. Etching of top surfaces of fins is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof. In some embodiments, etching the fins is performed by exposing an upper portion of fin material, extending above a top surface of a dielectric support medium deposited between fins and recessed below a top surface of the fin height in a prior manufacturing step, to a liquid chemical etch solution comprising one or more of the liquid chemical etchants described above. An upper portion of the fin material includes a top surface and sides of the fin material.

In some embodiments, the etching process is a dry-etch or plasma etch process. Plasma etching of a substrate material is performed using halogen-containing reactive gasses excited by an electromagnetic field to dissociate into ions. Reactive or etchant gases include $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed fin material by alternating electromagnetic fields or by fixed bias according to methods of plasma etching that are known in the art. In some embodiments, etching processes include presenting the exposed portions of fins of the functional area in an oxygen-containing atmosphere to oxidize an outer portion of the fin material, followed by a chemical trimming process such as plasma-etching or liquid chemical etching, as described above, to remove the oxidized semiconductor fin material and leave a modified fin behind. In some embodiments, fin oxidation followed by chemical trimming is performed to provide greater selectivity to the fin material and to reduce a likelihood of accidental fin material removal during a manufacturing process. In some embodiments, the exposed portions of fins of the functional area are top surfaces of the fins, the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

IC fab 1250 uses mask(s) 1245 fabricated by mask house 1230 to fabricate IC device 1260. Thus, IC fab 1250 at least indirectly uses IC design layout diagram 1222 to fabricate IC device 1260. In some embodiments, semiconductor wafer 1253 is fabricated by IC fab 1250 using mask(s) 1245 to form IC device 1260. In some embodiments, the IC fabrication includes performing one or more lithographic exposures based at least indirectly on IC design layout diagram 1222. Semiconductor wafer 1253 includes a silicon substrate or other proper substrate having material layers formed thereon. Semiconductor wafer 1253 further includes one or more of various doped regions, dielectric features, multi-level interconnects, and the like (formed at subsequent manufacturing steps).

Details regarding an integrated circuit (IC) manufacturing system (e.g., system 1200 of FIG. 12), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, conductive lines are created within the integrated circuit by depositing a layer of dielectric material on a layer of the integrated circuit having gate structures therein, followed by forming an opening in the dielectric material at the location of at least one track. In some embodiments, metallic seed material is added to exposed surfaces within the opening in the dielectric material and a layer of conductive material is added to the opening over the seed layer. In some embodiments, the layer of conductive material is added by electroplating. In some embodiments, the layer of conductive material is added by sputtering, e.g., from a metal target. In some embodiments, the layer of conductive material is added by chemical vapor deposition, including one or more of chemical vapor deposition (CVD), plasma-enhanced chemical vapor deposition (PECVD), atomic layer deposition (ALD), and the like. In some embodiments, conductive material on top of the layer of dielectric material is removed from the top of the layer of dielectric material by chemical mechanical polishing (CMP) and/or plasma etching to isolate portions of the conductive material in the openings within the layer of dielectric material.

In some embodiments, the conductive lines along various tracks of the integrated circuit layout or manufactured integrated circuit are separated from each other, by removing a length of a conductive line between two other conductive lines, and filing the volume of the removed length of conductive line with dielectric material (e.g., making a trench isolation structure between two conductive lines, wherein the trench isolation structure and the conductive lines each extend along the first direction). In some embodiments, portions of one or more adjoining conductive lines are isolated by etching through the conductive lines to form an insolation structure that extends in a second direction different from the direction in which the conductive lines extend through the layer of the integrated circuit. Active areas, or functional areas, or cells, of the integrated circuit, are separated from each other or other elements of the integrated circuit by the trench isolation structure between portions of conductive lines in a region of the integrated circuit. In some embodiments, the conductive lines of the integrated circuit extend perpendicular to gate electrodes and the voltage-carrying lines [$V_{DD}$ (drain voltage), $V_{SS}$ (source voltage)] of the cell of the integrated circuit. In some embodiments, the conductive lines of the integrated circuit extend parallel to the voltage-carrying lines [$V_{DD}$ (drain voltage), and $V_{SS}$ (source voltage)] of the integrated circuit, and parallel to the gate electrodes of the cell of the integrated circuit [see, e.g., FIG. 3A, functional areas 302A and 302B].

Aspects of the present disclosure relate to a method of modifying an integrated circuit layout, including steps for identifying, in an integrated circuit layout, at least one reverse signal net having a first conductive line and a second conductive line; determining whether the first conductive line and the second conductive line are subject to a parasitic capacitance above a parasitic capacitance threshold; determining whether to move the first conductive line in the integrated circuit layout; adjusting the integrated circuit layout by moving the first conductive line in the integrated circuit layout in response to determining to move the first conductive line; and inserting an isolation structure between the first and second conductive lines in the integrated circuit in response to determining not to move the first conductive line. In some embodiments, inserting the isolation structure includes inserting a capacitive isolation structure or additional dielectric material. In some embodiments, the method further includes inserting a capacitive isolation structure at a first position after moving the first conductive line, wherein the first conductive line is located at the first position before moving the first conductive line. In some embodiments, inserting the isolation structure includes inserting at least two isolation structures between the first conductive line and the second conductive line. In some embodiments, the method further includes determining an isolation structure line length, wherein, the first conductive line has a first line length, and the second conductive line has a second line length, in response to the first line length being equal to the second line length, the isolation structure line length is set to be equal to the first length, and wherein, in response to the first line length and the second line length being different lengths, the isolation structure line length is set to be equal to a longer length of the first length or the second length. In some embodiments, the method further includes aligning an end of the isolation structure between the first conductive line or the second conductive line with an end of the first conductive line or an end of the second conductive line in order to reduce an amount of the first conductive line and the second conductive line which are not separated by the isolation structure.

An aspect of this description relates to a method of modifying an integrated circuit layout. The method includes determining whether a first conductive line and a second conductive line are subject to a parasitic capacitance above a parasitic capacitance threshold. The method further includes adjusting the integrated circuit layout by moving the first conductive line in the integrated circuit layout in response to determining to move the first conductive line. The method further includes inserting an isolation structure between the first and second conductive lines in the integrated circuit layout in response to determining not to move the first conductive line. In some embodiments, adjusting the integrated circuit layout includes moving the first conductive line from a first routing track to a second routing track. In some embodiments, the integrated circuit layout includes a poly line extending in a first direction, and adjusting the integrated circuit layout includes moving the first conductive line in a direction parallel to the first direction. In some embodiments, the integrated circuit layout includes a poly line extending in a first direction, and adjusting the integrated circuit layout includes moving the first conductive line in a direction perpendicular to the first direction. In some embodiments, inserting the isolation structure includes inserting a plurality of isolation structures between the first conductive line and the second conductive line, and the isolation structure is one of the plurality of isolation structures. In some embodiments, the method further includes adjusting the integrated circuit layout by moving the second conductive line in the integrated circuit layout in response to determining to move the second conductive line. In some embodiments, inserting the isolation structure includes inserting the isolation structure along a routing track of the integrated circuit layout.

An aspect of this description relates to a device. The device includes a first conductive line as an input line. The device further includes a second conductive line as an output line, wherein the first conductive line and the second conductive line are in a same level of the integrated circuit. The device further includes a first passive isolation structure between the first conductive line and the second conductive line, wherein the first passive isolation structure and the second conductive line are each positioned at an integer multiple of an interval between the first conductive line and the first passive isolation structure. In some embodiments, the device further includes a second passive isolation structure between the first conductive line and the second conductive line. In some embodiments, the device further includes a third conductive line as a second input line, wherein the third conductive line is in the same level of the integrated circuit as the second conductive line. In some embodiments, the second conductive line is between the first conductive line and the third conductive line. In some embodiments, the device further includes a second passive isolation structure between the second conductive line and the third conductive line. In some embodiments, the device further includes a poly line extending in a first direction. In some embodiments, the first conductive line extends in a second direction perpendicular to the first direction. In some embodiments, the first conductive line extends in the first direction.

An aspect of this description relates to a non-transitory computer readable medium having instructions thereon for modifying an integrated circuit layout. The instructions are configured to cause a processor to determine whether a first conductive line and a second conductive line are subject to a parasitic capacitance above a parasitic capacitance threshold. The instructions are further configured to cause a processor to determine whether to insert a first isolation structure to the integrated circuit layout. The instructions are further configured to cause a processor to adjust the integrated circuit layout by inserting the first isolation structure between the first conductive line and the second conductive line of the integrated circuit layout. In some embodiments, the instructions are further configured to cause the processor to adjust the integrated circuit layout by inserting a plurality of isolation structures between the first conductive line and the second conductive line, and the first isolation structure is one of the plurality of isolation structures. In some embodiments, the instructions are further configured to cause the processor to adjust the integrated circuit layout by moving the first conductive line in the integrated circuit layout. In some embodiments, the instructions are further configured to cause the processor to move the first conductive line in a direction parallel to a poly line in the integrated circuit layout. In some embodiments, the instructions are further configured to cause the processor to move the first conductive line in a direction perpendicular to a poly line in the integrated circuit layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of modifying an integrated circuit layout, comprising:
    determining whether a first conductive line and a second conductive line are subject to a parasitic capacitance above a parasitic capacitance threshold;
    adjusting the integrated circuit layout by moving the first conductive line in the integrated circuit layout in response to determining to move the first conductive line; and
    inserting an isolation structure between the first and second conductive lines in the integrated circuit layout in response to determining not to move the first conductive line, wherein inserting the isolation structure comprises inserting the isolation structure along a routing track of the integrated circuit layout.

2. The method of claim 1, wherein adjusting the integrated circuit layout comprises moving the first conductive line from a first routing track to a second routing track.

3. The method of claim 1, wherein the integrated circuit layout comprises a poly line extending in a first direction, and adjusting the integrated circuit layout comprises moving the first conductive line in a direction parallel to the first direction.

4. The method of claim 1, wherein the integrated circuit layout comprises a poly line extending in a first direction, and adjusting the integrated circuit layout comprises moving the first conductive line in a direction perpendicular to the first direction.

5. The method of claim 1, wherein inserting the isolation structure comprises inserting a plurality of isolation structures between the first conductive line and the second conductive line, and the isolation structure is one of the plurality of isolation structures.

6. The method of claim 1, further comprising adjusting the integrated circuit layout by moving the second conductive line in the integrated circuit layout in response to determining to move the second conductive line.

7. The method of claim 1, wherein inserting the isolation structure comprises inserting a second isolation structure along a second routing track of the integrated circuit layout.

8. A non-transitory computer readable medium having instructions thereon for modifying an integrated circuit layout, the instructions are configured to cause a processor to
determine whether a first conductive line and a second conductive line are subject to a parasitic capacitance above a parasitic capacitance threshold;
determine whether to insert a first isolation structure to the integrated circuit layout; and
adjust the integrated circuit layout by inserting the first isolation structure between the first conductive line and the second conductive line of the integrated circuit layout, wherein inserting the first isolation structure comprises inserting the first isolation structure along a first routing track of the integrated circuit layout.

9. The non-transitory computer readable medium of claim 8, wherein the instructions are further configured to cause the processor to adjust the integrated circuit layout by inserting a plurality of isolation structures between the first conductive line and the second conductive line, and the first isolation structure is one of the plurality of isolation structures.

10. The non-transitory computer readable medium of claim 8, wherein the instructions are further configured to cause the processor to adjust the integrated circuit layout by moving the first conductive line in the integrated circuit layout.

11. The non-transitory computer readable medium of claim 10, wherein the instructions are further configured to cause the processor to move the first conductive line in a direction parallel to a poly line in the integrated circuit layout.

12. The non-transitory computer readable medium of claim 10, wherein the instructions are further configured to cause the processor to move the first conductive line in a direction perpendicular to a poly line in the integrated circuit layout.

13. A method of modifying an integrated circuit layout, comprising:
determining whether a first conductive line and a second conductive line are subject to a parasitic capacitance above a parasitic capacitance threshold; and
adjusting the integrated circuit layout in response to a determination that the parasitic capacitance is above the parasitic capacitance threshold, wherein adjusting the integrated circuit layout comprises at least one of:
moving the first conductive line in the integrated circuit layout; or
inserting an isolation structure between the first conductive line and the second conductive line, wherein inserting the isolation structure comprises inserting the isolation structure along a routing track of the integrated circuit layout.

14. The method of claim 13, wherein adjusting the integrated circuit layout comprises:
moving the first conductive line in the integrated circuit layout; and
inserting the isolation structure between the first conductive line and the second conductive line.

15. The method of claim 13, further comprising determining whether to move the first conductive line based on at least one of an initial separation distance between the first conductive line and the second conductive line, available locations for moving the first conductive line, routing complexity for moving the first conductive line, or a priority of a signal net including the first conductive line.

16. The method of claim 13, further comprising increasing a probability of moving the first conductive line in response to the first conductive line being part of a signal net having a low priority.

17. The method of claim 13, wherein inserting the isolation structure comprises inserting a plurality of isolation structures between the first conductive line and the second conductive line.

18. The method of claim 13, further comprising:
determining whether a third conductive line and the second conductive line are subject to a second parasitic capacitance above the parasitic capacitance threshold; and
adjusting the integrated circuit layout in response to a determination that the second parasitic capacitance is above the parasitic capacitance threshold, wherein adjusting the integrated circuit layout comprises at least one of:
moving the third conductive line in the integrated circuit layout; or
inserting a second isolation structure between the third conductive line and the second conductive line.

19. The method of claim 18, wherein adjusting the integrated circuit layout comprises:
moving the third conductive line in the integrated circuit layout; and
inserting the second isolation structure between the third conductive line and the second conductive line.

20. The method of claim 19, wherein adjusting the integrated circuit layout comprises:
moving the first conductive line in the integrated circuit layout; and
inserting the isolation structure between the first conductive line and the second conductive line.

* * * * *